US012633913B2

(12) United States Patent
Yanagishima

(10) Patent No.: US 12,633,913 B2
(45) Date of Patent: May 19, 2026

(54) GATE DRIVER

(71) Applicant: Rohm Co., Ltd., Kyoto (JP)

(72) Inventor: Daiki Yanagishima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 146 days.

(21) Appl. No.: 18/593,692

(22) Filed: Mar. 1, 2024

(65) Prior Publication Data

US 2024/0204772 A1     Jun. 20, 2024

Related U.S. Application Data

(63) Continuation of application No. PCT/JP2022/025070, filed on Jun. 23, 2022.

(30) Foreign Application Priority Data

Sep. 3, 2021     (JP) ................................. 2021-143703

(51) Int. Cl.
*H03K 17/56*     (2006.01)
*H03H 7/06*     (2006.01)
*H10D 1/20*     (2025.01)

(52) U.S. Cl.
CPC ............... *H03K 17/56* (2013.01); *H03H 7/06* (2013.01); *H10D 1/20* (2025.01)

(58) Field of Classification Search
CPC ...... H03K 17/56; H03K 17/165; H03K 17/16; H02M 1/0054; H02M 1/32; H02M 1/44; H02M 1/0029; H02M 1/08
See application file for complete search history.

(56) References Cited

U.S. PATENT DOCUMENTS

| | | | |
|---|---|---|---|
| 4,692,932 A * | 9/1987 | Denhez ................. | H04J 3/0688 |
| | | | 375/357 |
| 10,855,275 B2 * | 12/2020 | Garg .................. | H03K 17/6871 |
| 12,132,392 B2 * | 10/2024 | Nakamori ............ | H02M 1/088 |
| 2016/0248243 A1 * | 8/2016 | Yanagishima ......... | H02H 3/087 |

FOREIGN PATENT DOCUMENTS

| | | | |
|---|---|---|---|
| JP | H09-047015 | | 2/1997 |
| JP | 2013-005231 | | 1/2013 |
| JP | 2019-129580 | * | 8/2019 |
| JP | 2021-010258 | | 1/2021 |

OTHER PUBLICATIONS

International Search Report and Written Opinion in International Appln. No. PCT/JP2022/025070, mailed on Sep. 6, 2022, 17 pages (with machine translation).

* cited by examiner

*Primary Examiner* — Sibin Chen
(74) *Attorney, Agent, or Firm* — Fish & Richardson P.C.

(57) ABSTRACT

A gate driver includes: a gate driving circuit configured to generate a gate driving signal for a power device according to a gate control signal; and a driving capacity switch circuit configured to raise the gate driving capacity of the gate driving circuit when a time-variation signal obtained by passing the gate driving signal in the on-transition period of the power device through a high-pass filter becomes lower than a threshold value.

8 Claims, 21 Drawing Sheets

GATE DRIVER

CROSS-REFERENCE TO RELATED APPLICATIONS

This nonprovisional application is a continuation application of International Patent Application No. PCT/JP2022/025070 filed on Jun. 23, 2022, which claims priority Japanese Patent Application No. 2021-143703 filed on Sep. 3, 2021, the entire contents of which are hereby incorporated by reference.

TECHNICAL FIELD

The disclosure herein relates to gate drivers.

BACKGROUND ART

Nowadays, gate drivers are used in various applications to drive power devices such as MOSFETs (metal-oxide-semiconductor field-effect transistors) and IGBTs (insulated-gate bipolar transistors).

One example of the known technology related to what is mentioned above is seen in Patent Document 1 identified below.

CITATION LIST

Patent Literature

Patent Document 1: JP-A-2021-010258

DESCRIPTION OF EMBODIMENTS

<Signal Transmission Device (Basic Configuration)>

Figure 1:
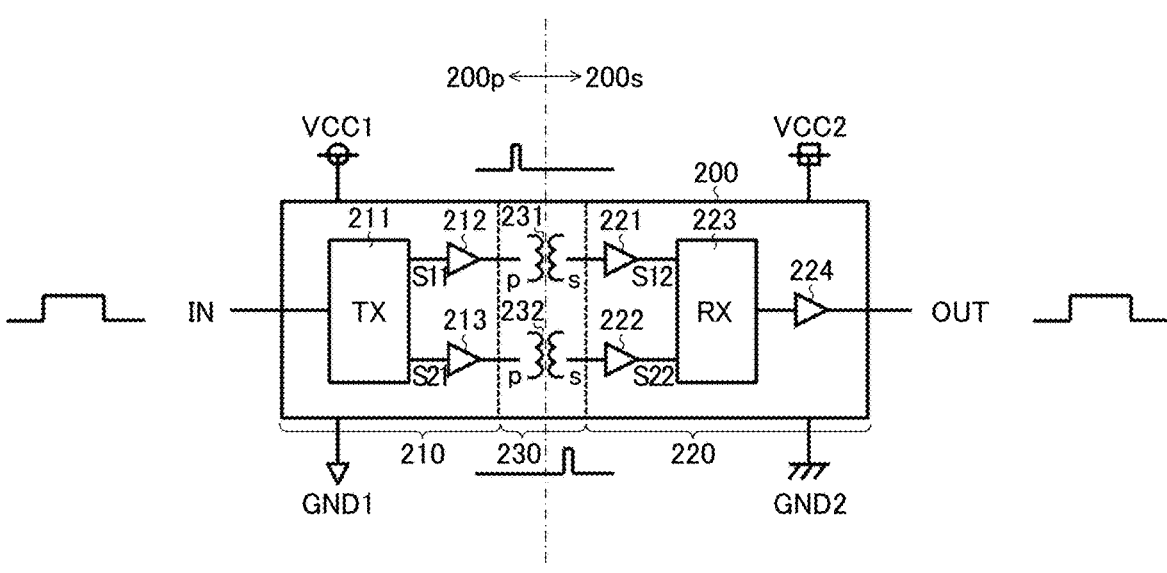
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200p (VCC1-GND1 system) and a secondary circuit system 200s (VCC2-GND2 system), transmits a pulse signal from the primary circuit system 200p to the secondary circuit system 200s to drive the gate of a switching device (unillustrated) provided in the secondary circuit system 200s. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231p, the reception pulse signal S12 from the secondary coil 231s. Likewise, the transformer 232 outputs, according to the transmission pulse signal S21 fed to the primary coil 232p, the reception pulse signal S22 from the secondary coil 232s.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200p to the secondary circuit system 200s.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
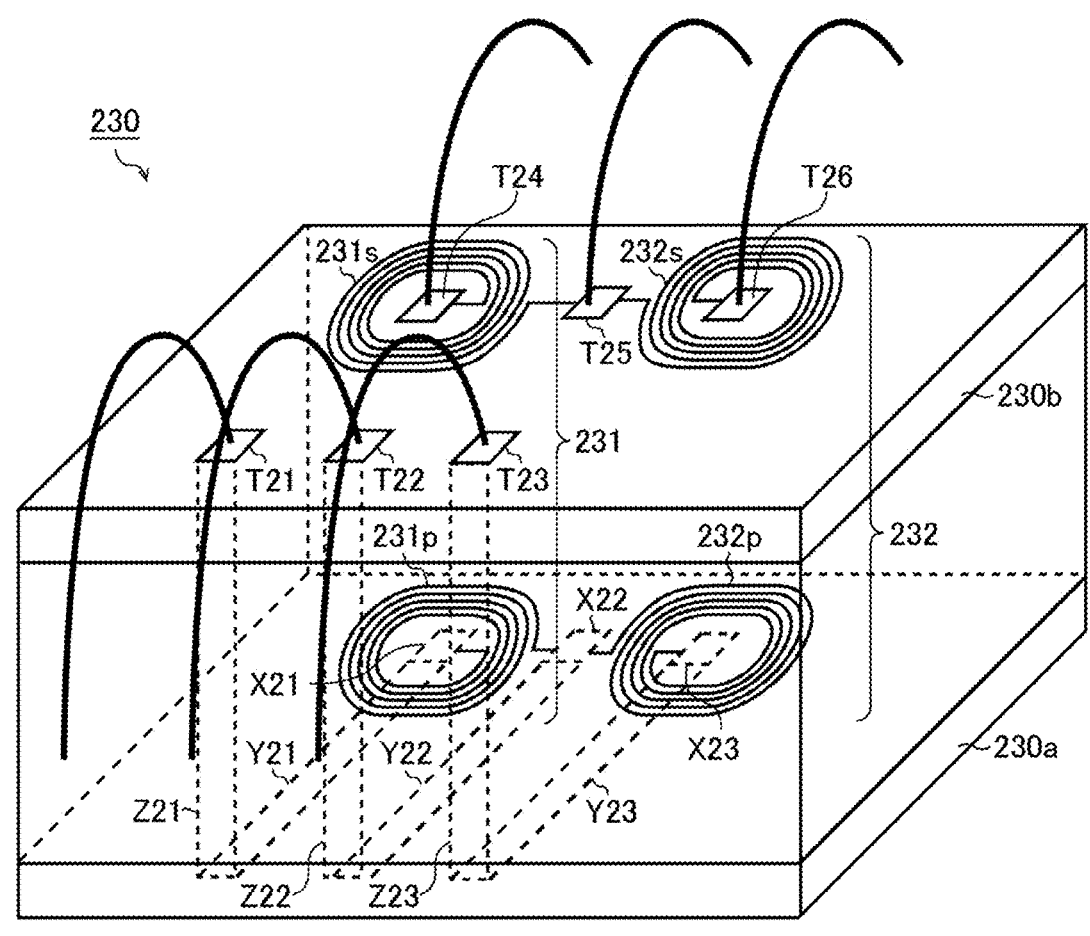
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231p and a secondary coil 231s that face each other in the up-down direction; the transformer 232 includes a primary coil 232p and a secondary coil 232s that face each other in the up-down direction.

The primary coils 231p and 232p are both formed in a first wiring layer (lower layer) 230a in the transformer chip 230. The secondary coils 231s and 231s are both formed in a second wiring layer (the upper layer in the diagram) 230b in the transformer chip 230. The secondary coil 231s is disposed right above the primary coil 231p and faces the primary coil 231p; the secondary coil 232s is disposed right above the primary coil 232p and faces the primary coil 232p.

The primary coil 231p is laid in a spiral shape so as to encircle an internal terminal X21 clockwise, starting at the first terminal of the primary coil 231p, which is connected to the internal terminal X21. The second terminal of the primary coil 231p, which corresponds to its end point, is connected to an internal terminal X22. Likewise, the primary coil 232p is laid in a spiral shape so as to encircle an internal terminal X23 anticlockwise, starting at the first terminal of the primary coil 232p, which is connected to the internal terminal X23. The second terminal of the primary coil 232p, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230b. The internal terminal X22 is connected, via a wiring Y22 and a via Z22 both conductive, to an external terminal T22 in the second layer 230b. The internal terminal X23 is connected, via a wiring Y23 and a via Z23 both conductive, to an external terminal T23 in the second layer 230b. The external terminals T21 to T23 are disposed in a straight row and are used for wire-bonding with the controller chip 210.

The secondary coil 231s is laid in a spiral shape so as to encircle an external terminal T24 anticlockwise, starting at the first terminal of the secondary coil 231s, which is connected to the external terminal T24. The second terminal of the secondary coil 231s, which corresponds to its end point, is connected to an external terminal T25. Likewise, the secondary coil 232s is laid in a spiral shape so as to encircle an external terminal T26 clockwise, starting at the first terminal of the secondary coil 232s, which is connected to the external terminal T26. The second terminal of the secondary coil 232s, which corresponds to its end point, is connected to the external terminal T25. The external terminals T24, T25, and T26 are disposed in a straight row in the illustrated order and are used for wire-bonding with the driver chip 220.

The secondary coils 231s and 232s are AC-connected to the primary coils 231p and 232p, respectively, by magnetic coupling, and are DC-isolated from the primary coils 231p and 232p. That is, the driver chip 220 is AC-connected to the controller chip 210 via the transformer chip 230, and is DC-isolated from the controller chip 210 by the transformer chip 230.

<Transformer Chip (Two-Channel Type)>

Figure 3:
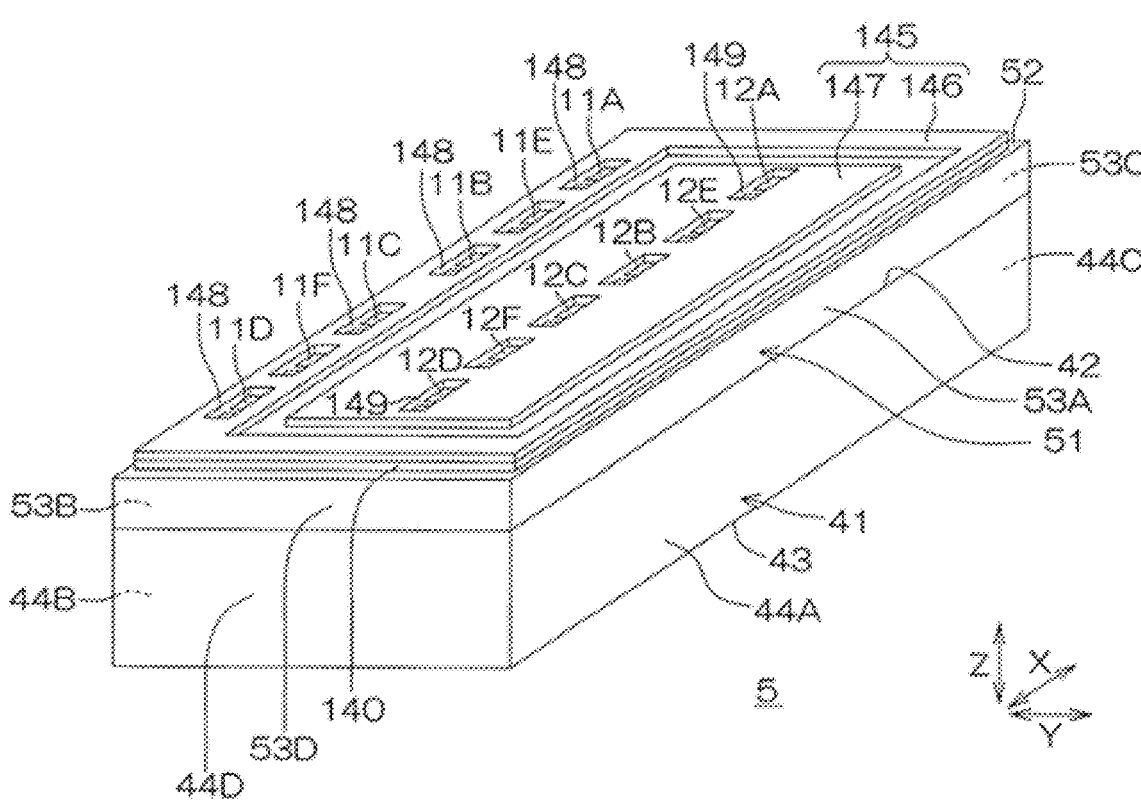
FIG. 3 a perspective view of a semiconductor device used as a two-channel transformer chip.
Figure 4:
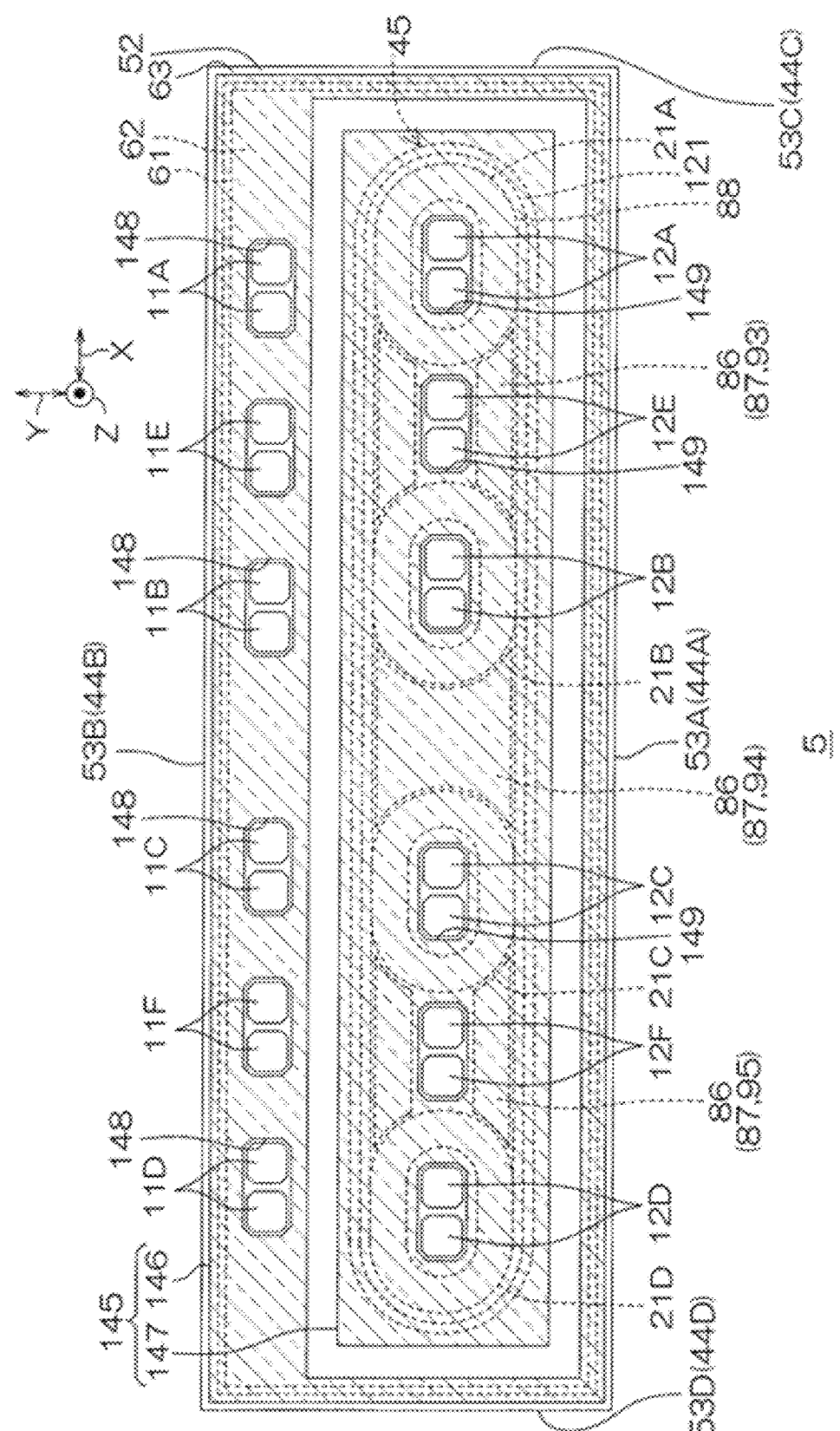
FIG. 4 is a plan view of the semiconductor device shown in FIG. 3.
Figure 5:
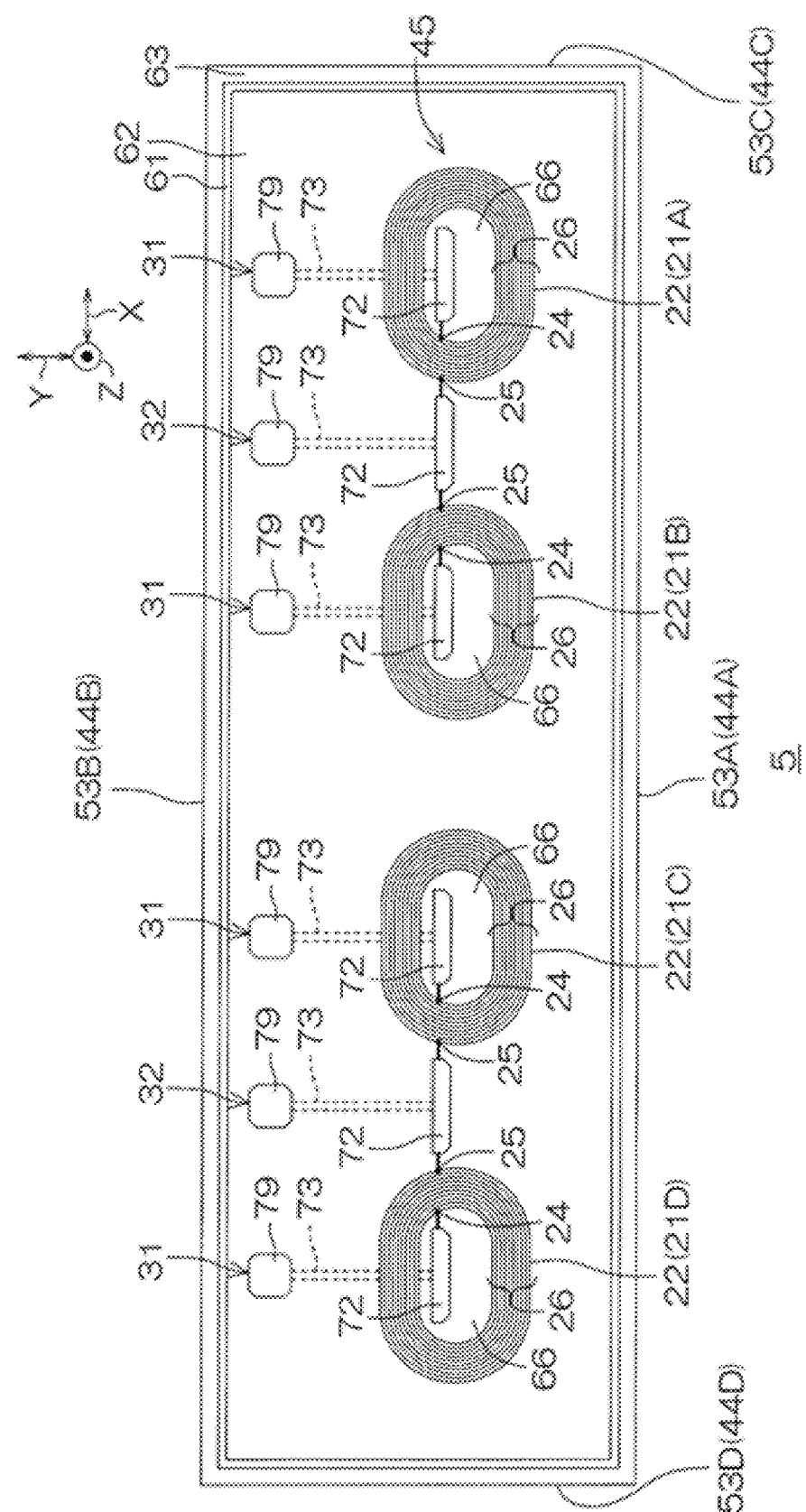
FIG. 5 is a plan view of a layer in the semiconductor device shown in FIG. 3 where low-potential coils are formed.
Figure 6:
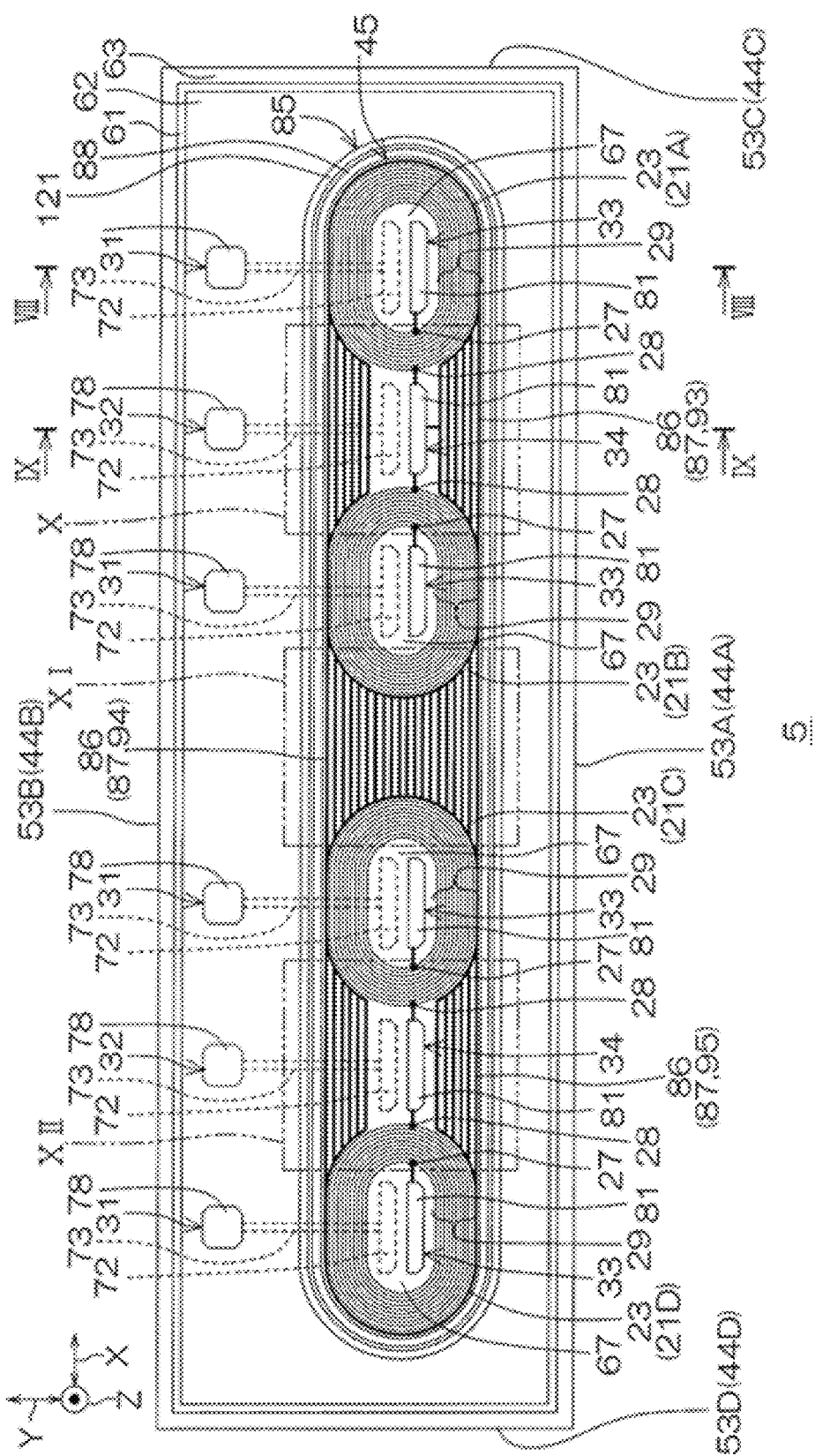
FIG. 6 is a plan view of a layer in the semiconductor device shown in FIG. 3 where high-potential coils are formed.
Figure 7:
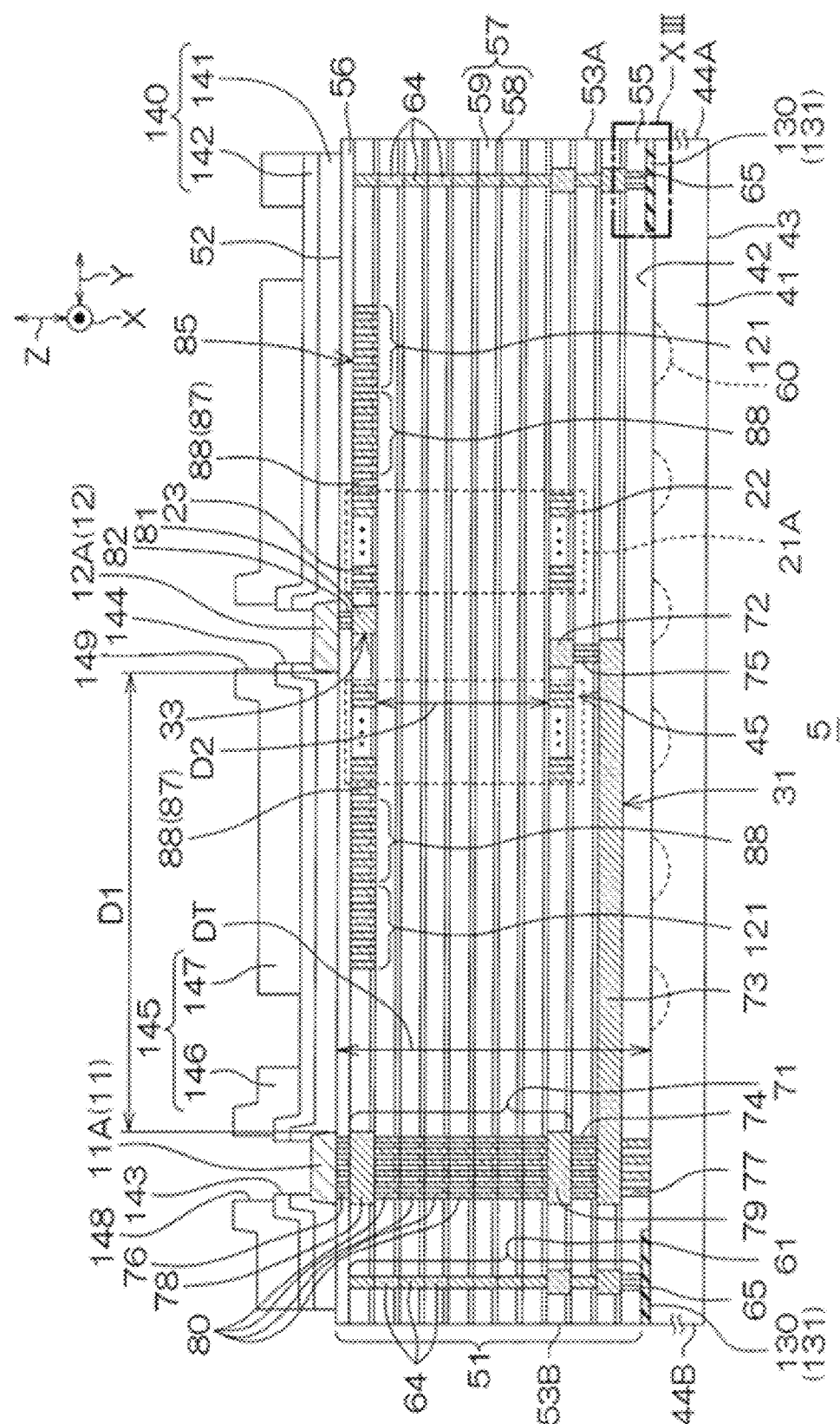
FIG. 7 is a cross-sectional view taken along line VIII-VIII shown in FIG. 6.
Figure 8:
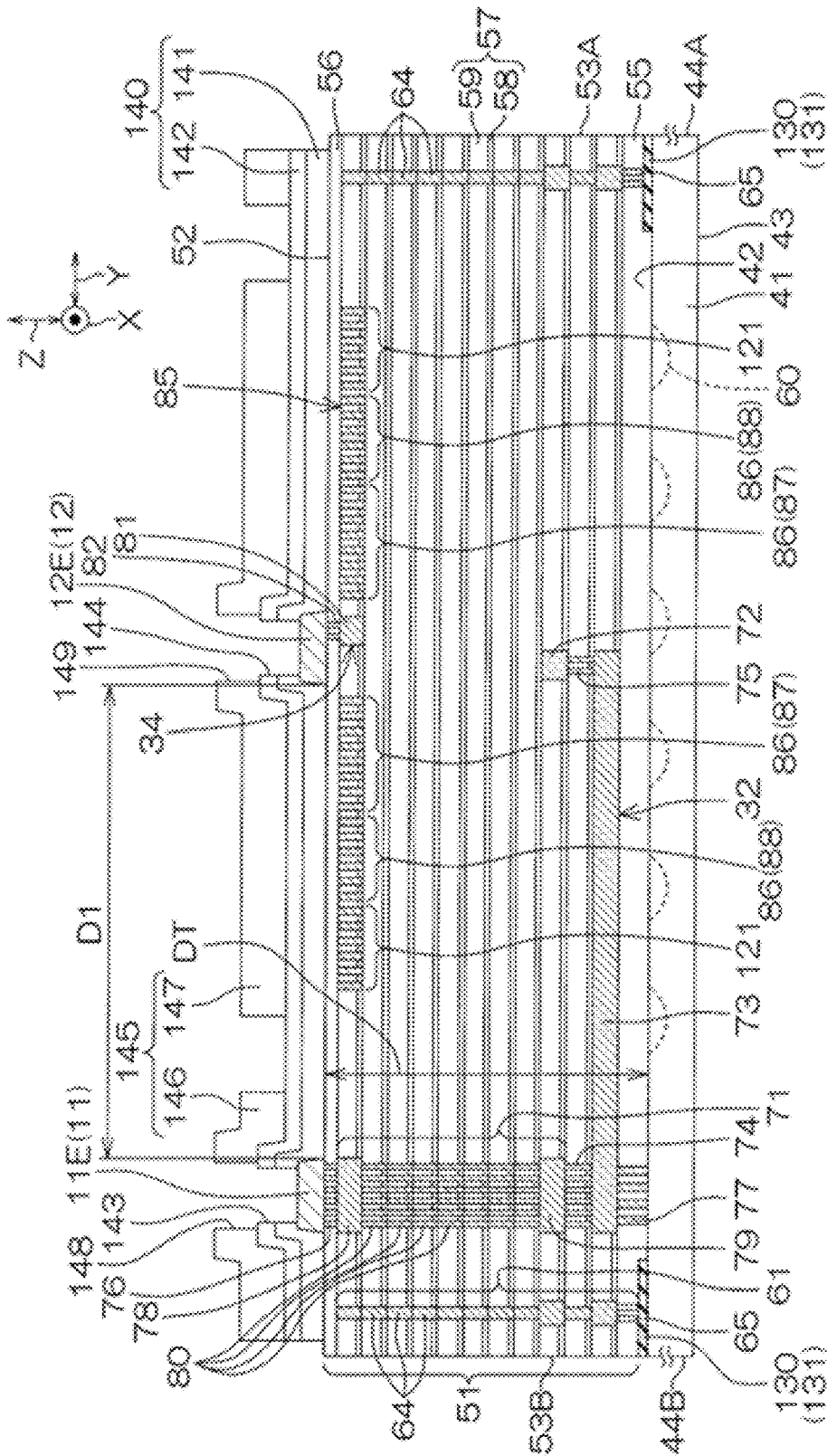
FIG. 8 is a cross-sectional view taken along line IX-IX shown in FIG. 6.
Figure 9:
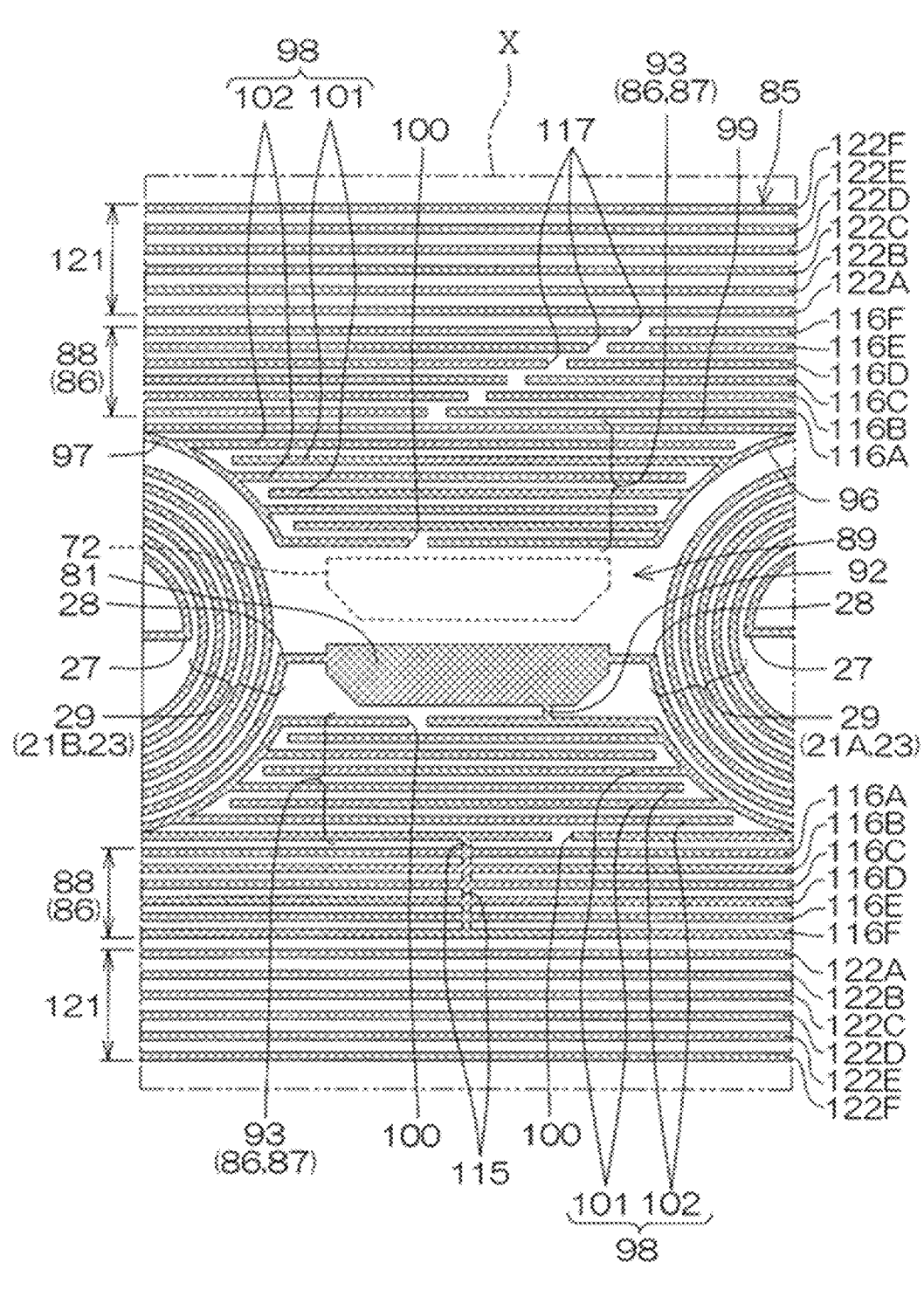
FIG. 9 is an enlarged view of region X shown in FIG. 6.
Figure 10:
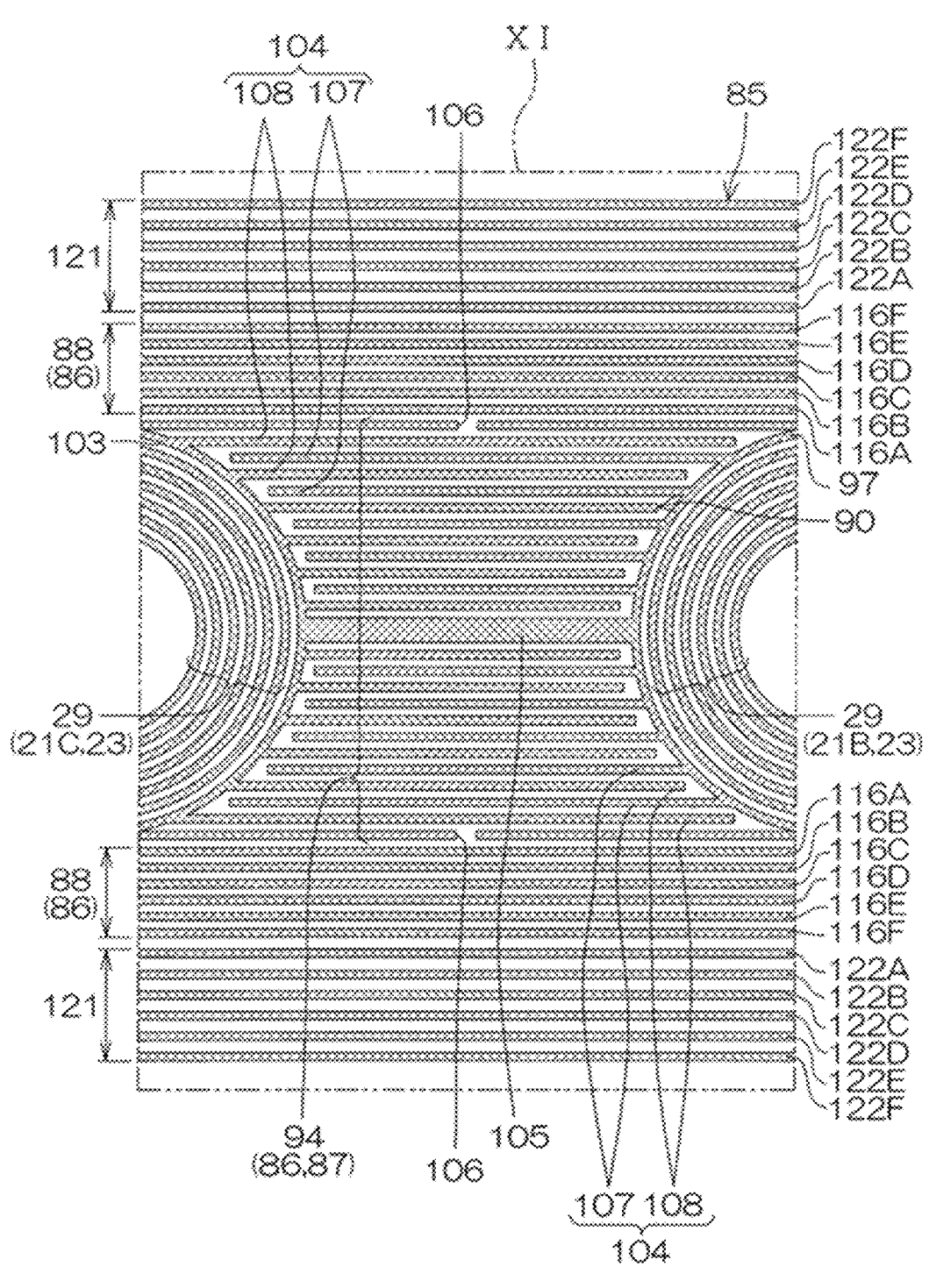
FIG. 10 is an enlarged view of region XI shown in FIG. 6.
Figure 11:
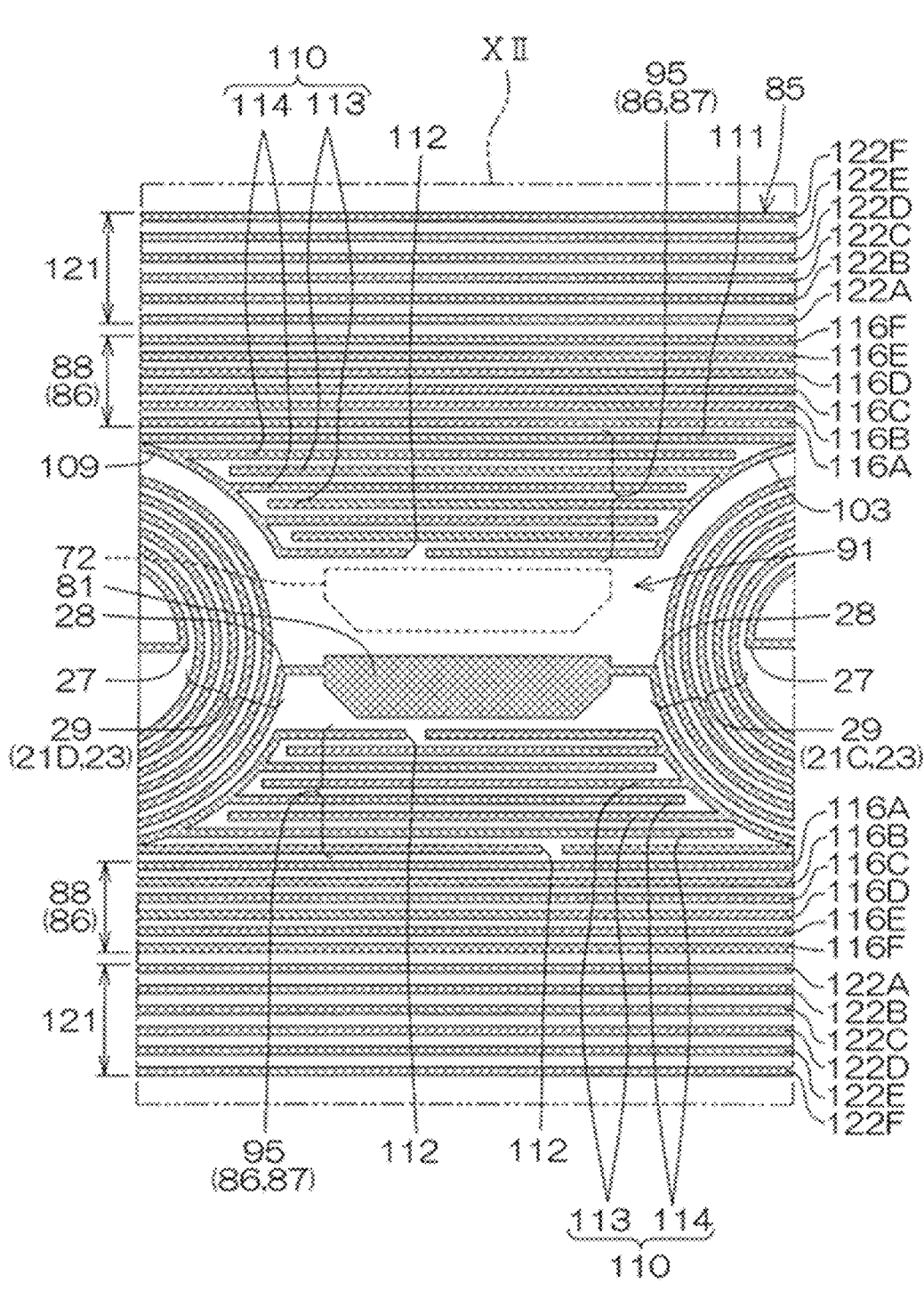
FIG. 11 is an enlarged view of region XII shown in FIG. 6.
Figure 12:
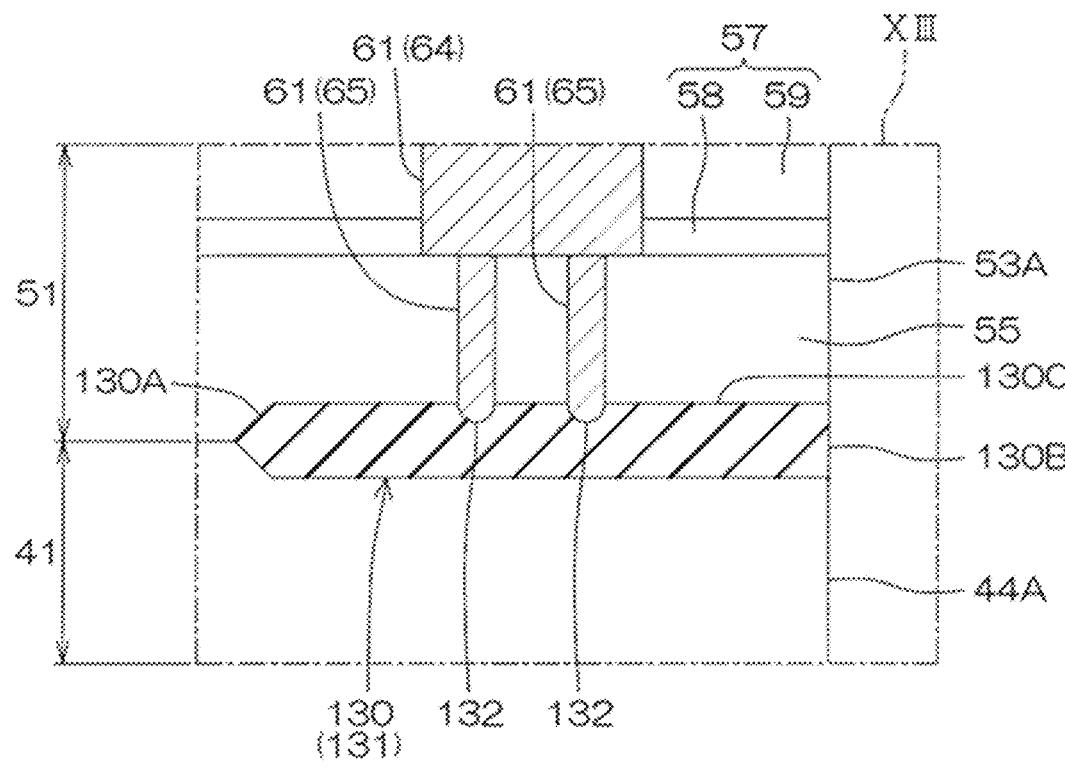
FIG. 12 is an enlarged view (showing a separation structure) of region XIII shown in FIG. 7.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6. FIG. 8 is a cross-sectional view taken along line IX-IX shown in FIG. 6. FIG. 9 is an enlarged view of region X shown in FIG. 6. FIG. 10 is an enlarged view of region XI shown in FIG. 6. FIG. 11 is an enlarged view of region XII shown in FIG. 6. FIG. 12 is an enlarged view of region XIII shown in FIG. 7, showing a separation structure 130.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multilayer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 m or more but 3 μm or less (e.g., about 2 m).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 μm or more but 1 μm or less (e.g., about 0.3 m).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 μm or less (e.g., about 2 m). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 8, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The body layer is embedded in the recessed space defined by the barrier layer. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but 5 μm or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 8, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A)

in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a strip in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIG. 8, the plurality of second low-potential wirings 32 are electrically connected respectively to the corresponding low-potential terminals 11E and 11F and to the first outer ends 25 of the low-potential coils 22 of the corresponding transformers 21A to 21D. The plurality of second low-potential wirings 32 have similar structures. In the following description, the structure of the second low-potential wiring 32 connected to the fifth low-potential terminal 11E and to the first transformer 21A (second transformer 21B) will be described as an example. No separate description will be given of the structures of the other second low-potential wirings 32, to which the description of the structure of the second low-potential wiring 32 connected to the first transformer 21A (second transformer 21B) is to be taken to apply.

Like the first low-potential wiring 31, the second low-potential wiring 32 includes a through wiring 71, a low-potential connection wiring 72, a lead wiring 73, a first connection plug electrode 74, a second connection plug electrode 75, a pad plug electrodes 76, and a substrate plug electrode 77. The second low-potential wiring 32 has a similar structure to the first low-potential wiring 31 except that the low-potential connection wiring 72 is electrically connected to the first outer end 25 of the first transformer 21A (low-potential coil 22) and to the first outer end 25 of the second transformer 21B (low-potential coil 22).

The low-potential connection wiring 72 of the second low-potential wiring 32 is formed in the same interlayer insulation layer 57 as the low-potential coil 22, around the low-potential coil 22. Specifically, the low-potential connection wiring 72 is formed in a region between two adjacent low-potential coils 22 as seen in a plan view. The pad plug electrodes 76 is formed in the top insulation layer 56, in a region between the low-potential terminal 11 (fifth low-potential terminal 11E) and the low-potential connection wiring 72, and is electrically connected to the low-potential terminal 11 and to the low-potential connection wiring 72.

Referring to FIG. 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 8, the plurality of second high-potential wirings 34 are electrically connected to the corresponding high-potential terminals 12E and 12F and to the second outer ends 28 of the corresponding transformers 21A to 21D (high-potential coils 23). The plurality of second high-potential wirings 34 have similar structures. In the following description, the structure of the second high-potential wiring 34 connected to the fifth high-potential terminal 12E and to the first transformer 21A (second transformer 21B) will be described as an example. No separate description will be given of the structures of the other second high-potential wirings 34, to which the description of the structure of the second high-potential wiring 34 connected to the first transformer 21A (second transformer 21B) is to be taken to apply.

Like the first high-potential wiring 33, the second high-potential wiring 34 includes a high-potential connection wiring 81 and a pad plug electrodes 82. The second high-potential wiring 34 has a similar structure to the first high-potential wiring 33 except that the high-potential connection wiring 81 is electrically connected to the second outer end 28 of the first transformer 21A (high-potential coil 23) and to the second outer end 28 of the second transformer 21B (high-potential coil 23).

The high-potential connection wiring 81 of the second high-potential wiring 34 is formed in the same interlayer insulation layer 57 as the high-potential coil 23, around the high-potential coil 23. The high-potential connection wiring 81 is formed in a region between two adjacent high-potential coils 23 as seen in a plan view, and faces the high-potential terminal 12 (fifth high-potential terminal 12E) in the normal direction Z. The high-potential connection wiring 81 is formed at an interval from the low-potential connection wiring 72 as seen in a plan view, and does not face the low-potential connection wiring 72 in the normal direction Z.

The pad plug electrodes 82 is formed in the top insulation layer 56, in a region between the high-potential terminal 12 (fifth high-potential terminal 12E) and the high-potential connection wiring 81, and is electrically connected to the high-potential terminal 12 and to the high-potential connection wiring 81.

Referring to FIGS. 7 and 8, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 50 μm or less. Preferably, the distance D2 is 5 μm or more but 25 μm or less. The distances D1 and D2 can have any values, which are adjusted appropriately according to the desired dielectric strength voltage.

Referring to FIGS. 6 to 11, the semiconductor device 5 has a dummy pattern 85 that is embedded in the insulation layer 51 so as to be located around the transformers 21A to 21D as seen in a plan view. In FIGS. 9 to 11, the dummy pattern 85 is indicated by hatching. The dummy pattern 85 includes a conducting member. Preferably, the dummy pattern 85 is formed of the same conductive material as the low-potential coil 22 and the like. That is, preferably, like the low-potential coil 22 and the like, the dummy pattern 85 includes a barrier layer and a body layer.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23.

In this embodiment, the dummy pattern 85 is patterned in dense lines so as to partly cover and partly expose a region around one or a plurality of high-potential coils 23 as seen in a plan view. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

Preferably, the dummy pattern 85 is formed in a region closer to the high-potential coil 23 than to the low-potential terminal 11 as seen in a plan view. The dummy pattern 85 being closer to the high-potential coil 23 as seen in a plan view means that the distance between the dummy pattern 85 and the high-potential coil 23 is smaller than the distance between the dummy pattern 85 and the low-potential terminal 11.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly.

Preferably, the dummy pattern 85 is formed around a plurality of high-potential coils 23 so as to lie in a region between a plurality of adjacent high-potential coils 23 as seen in a plan view. In that way, by use of the region between the plurality of adjacent high-potential coils 23, unwanted electric field concentration on the plurality of high-potential coils 23 can be suppressed.

Preferably, the dummy pattern 85 lies in a region between the low-potential terminal 11 and the high-potential coil 23 as seen in a plan view. In that way, unwanted conduction between the low-potential terminal 11 and the high-potential coil 23 resulting from electric field concentration on the high-potential coil 23 can be suppressed. Preferably, the dummy pattern 85 lies in a region between the low- and high-potential terminals 11 and 12 as seen in a plan view. In that way, unwanted conduction between the low- and high-potential terminals 11 and 12 resulting from electric field concentration on the high-potential coil 23 can be suppressed.

In this embodiment, the dummy pattern 85 is formed along a plurality of high-potential coils 23 as seen in a plan view, and lies in a region between a plurality of adjacent high-potential coils 23. Moreover, the dummy pattern 85 surrounds an entire region including the plurality of high-potential coils 23 and the plurality of high-potential terminals 12 as seen in a plan view. Moreover, the dummy pattern 85 lies in a region between the plurality of low-potential terminals 11A to 11F and the plurality of high-potential coils 23 as seen in a plan view. Moreover, the dummy pattern 85 lies in a region between the plurality of low-potential terminals 11A to 11F and the plurality of high-potential coils 12A to 12F as seen in a plan view.

Referring to FIGS. 6 to 11, the dummy pattern 85 includes a plurality of dummy patterns that are in varying electrical states. The dummy pattern 85 includes a high-potential dummy pattern 86. The high-potential dummy pattern 86 is formed in the insulation layer 51 so as to be located around the transformers 21A to 21D as seen in a plan view. The high-potential dummy pattern 86 is formed in a pattern different (discontinuous) from that of either of the high- and low-potential coils 23 and 22, and is independent of the transformers 21A to 21D. That is, the high-potential dummy pattern 86 does not function as part of the transformers 21A to 21D.

In this embodiment, the high-potential dummy pattern 86 is patterned in dense lines so as to partly cover and partly expose a region around the potential coil 23 as seen in a plan view. In this embodiment, the high-potential dummy pattern 86 is patterned at a line density per unit area that is equal to the line density of the high-potential coil 23. The line density of the high-potential dummy pattern 86 being equal to the line density of the high-potential coil 23 means that the line density of the high-potential dummy pattern 86 falls within the range of ±20% of the line density of the high-potential coil 23.

The high-potential dummy pattern 86 shields electric fields between the low- and high-potential coils 22 and 23 in the transformers 21A to 21D to suppress electric field concentration on the high-potential coil 23. Specifically, the high-potential dummy pattern 86, by shielding electric fields between the low- and high-potential coils 22 and 23, directs the electric fields that leak upward from the high-potential coil 23 away from the high-potential coil 23. In this way, electric field concentration on the high-potential coil 23 ascribable to the electric fields that leak upward from the high-potential coil 23 is suppressed.

The high-potential dummy pattern 86 is fed with a voltage higher than the voltage fed the to low-potential coil 22. In this way, it is possible to suppress a voltage drop between the high-potential coil 23 and the high-potential dummy pattern 86, and thereby to suppress electric field concentration on the high-potential coil 23. Preferably, the high-potential dummy pattern 86 is fed with the voltage that is fed to the high-potential coil 23. That is, preferably, the high-potential dummy pattern 86 is fixed at the same potential as the high-potential coil 23. It is thus possible to reliably suppress a voltage drop between the high-potential coil 23 and the high-potential dummy pattern 86, and thus to suppress electric field concentration on the high-potential coil 23 properly.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

In that way, electric field concentration on the high-potential coil 23 can be suppressed properly. The smaller the distance between the high-potential dummy pattern 86 and the high-potential coil 23 with respect to the normal direction Z, the more effectively electric field concentration on the high-potential coil 23 can be suppressed. Preferably, the high-potential dummy pattern 86 is formed in the same interlayer insulation layer 57 as the high-potential coil 23. In that way, electric field concentration on the high-potential coil 23 can be suppressed more properly.

Preferably, the high-potential dummy pattern 86 is formed in a region closer to the high-potential coil 23 than to the low-potential terminal 11 as seen in a plan view. The high-potential dummy pattern 86 being closer to the high-potential coil 23 as seen in a plan view means that the distance between the high-potential dummy pattern 86 and the high-potential coil 23 is smaller than the distance between the high-potential dummy pattern 86 and the low-potential terminal 11.

Preferably, the high-potential dummy pattern 86 is formed around a plurality of high-potential coils 23 so as to lie in a region between a plurality of adjacent high-potential coils 23 as seen in a plan view. In that way, by use of the region between the plurality of adjacent high-potential coils 23, unwanted electric field concentration on the plurality of high-potential coils 23 can be suppressed.

Preferably, the high-potential dummy pattern 86 lies in a region between the low-potential terminal 11 and the high-potential coil 23 as seen in a plan view. In that way, unwanted conduction between the low-potential terminal 11 and the high-potential coil 23 resulting from electric field concentration on the high-potential coil 23 can be suppressed. Preferably, the high-potential dummy pattern 86 lies in a region between the low- and high-potential terminals 11 and 12 as seen in a plan view. In that way, unwanted conduction between the low- and high-potential terminals 11 and 12 resulting from electric field concentration on the high-potential coil 23 can be suppressed.

In this embodiment, the high-potential dummy pattern 86 is formed along a plurality of high-potential coils 23 as seen in a plan view, and lies in a region between a plurality of adjacent high-potential coils 23. Moreover, the high-potential dummy pattern 86 surrounds an entire region including the plurality of high-potential coils 23 and the plurality of high-potential terminals 12 as seen in a plan view. Moreover, the high-potential dummy pattern 86 lies in a region between the plurality of low-potential terminals 11A to 11F and the plurality of high-potential coils 23 as seen in a plan view. Moreover, the high-potential dummy pattern 86 lies in a region between the plurality of low-potential terminals 11A to 11F and the plurality of high-potential coils 12A to 12F as seen in a plan view.

The high-potential dummy pattern 86 is patterned in a region between a plurality of adjacent high-potential coils 23 as seen in a plan view, around the high-potential terminals 12E and 12F so as to expose a region right below the high-potential terminals 12E and 12F. The high-potential dummy pattern 86 may partly face the high-potential terminals 12A to 12F in the normal direction Z. In that case, like the high-potential dummy pattern 86, the high-potential terminals 12E and 12F, by shielding electric fields, suppresses electric fields that leak upward from the high-potential coil 23. That is, the high-potential terminals 12E and 12F are formed as a shield conductor layer that, along with the high-potential dummy pattern 86, suppresses electric field concentration on the high-potential coil 23.

Preferably, the high-potential dummy pattern 86 is formed to have ends. It is thus possible to suppress formation of a loop circuit (closed circuit) of current in the high-potential dummy pattern 86. This helps suppress noise ascribable to a current passing across the high-potential dummy pattern 86. It is thus possible to suppress unwanted electric field concentration ascribable to noise, and to suppress variation of the electrical characteristics of the transformers 21A to 21D.

Specifically, the high-potential dummy pattern 86 includes a first high-potential dummy pattern 87 and a second high-potential dummy pattern 88. The first high-potential dummy pattern 87 is formed in a region between a plurality of adjacent transformers 21A to 21D (a plurality of high-potential coils 23) as seen in a plan view. The second high-potential dummy pattern 88 is formed in a region outside the region between the plurality of adjacent transformers 21A to 21D (plurality of high-potential coils 23) as seen in a plan view.

In the following description, a region between the first transformer 21A (high-potential coil 23) and the second transformer 21B (high-potential coil 23), which are adjacent to each other, will be referred to as a first region 89; a region between the second transformer 21B (high-potential coil 23) and the third transformer 21C (high-potential coil 23), which are adjacent to each other, will be referred to as a second region 90; and a region between the third transformer 21C (high-potential coil 23) and the fourth transformer 21D (high-potential coil 23), which are adjacent to each other, will be referred to as a third region 91.

In this embodiment, the first high-potential dummy pattern 87 is electrically connected via the first high-potential wiring 33 to the high-potential terminal 12 (fifth high-potential terminal 12E). Specifically, the first high-potential dummy pattern 87 includes a first connection part 92 that is connected to the first high-potential wiring 33. The first connection part 92 can be located at any place. Thus, the first high-potential dummy pattern 87 is fixed at the same potential as the plurality of high-potential coils 23.

Specifically, the first high-potential dummy pattern 87 includes a first pattern 93 formed in the first region 89, a second pattern 94 formed in the second region 90, and a third pattern 95 formed in the third region 91. Thus, in the first, second, and third regions 89, 90, and 91, the first high-potential dummy pattern 87 suppresses electric fields that leak upward from the high-potential coil 23 and suppresses electric field concentration on the plurality of adjacent high-potential coils 23.

In this embodiment, the first, second, and third patterns 93, 94, and 95 are formed integrally and are fixed at the same potential. The first, second, and third patterns 93, 94, and 95 can be separate from each other so long as they are fixed at the same potential.

Referring to FIGS. 6 and 9, the first pattern 93 is connected via the first connection part 92 to the first high-potential wiring 33. The first pattern 93 is patterned in dense lines so as to cover and hide part of the first region 89 as seen in a plan view. The first pattern 93 is formed in the first region 89 at an interval from the high-potential terminal 12 (fifth high-potential terminal 12E) as seen in a plan view, and does not face the high-potential terminal 12 in the normal direction Z. The first pattern 93 is formed at an interval from the low-potential connection wiring 72 as seen in a plan view, and does not face the low-potential connection wiring 72 in the normal direction Z. This results in an increased insulation distance between the first pattern 93 and the low-potential connection wiring 72 and gives the insulation layer 51 an increased dielectric strength voltage.

The first pattern 93 includes a first outer circumferential line 96, a second outer circumferential line 97, and a plurality of first middle lines 98. The first outer circumferential line 96 extends in the shape of a strip along the circumference of the high-potential coil 23 of the first transformer 21A. In this embodiment, the first outer circumferential line 96 is formed in the shape of a ring with an open end in the first region 89 as seen in a plan view. The width of the open end of the first outer circumferential line 96 is smaller than the width of the high-potential coil 23 along the second direction Y.

The width of the first outer circumferential line 96 can be 0.1 μm or more but 5 m or less. Preferably, the width of the first outer circumferential line 96 is 1 μm or more but 3 μm or less. The width of the first outer circumferential line 96 is defined by its width in the direction perpendicular to the direction in which the first outer circumferential line 96 extends. Preferably, the width of the first outer circumferential line 96 is equal to the width of the high-potential coil 23. The width of the first outer circumferential line 96 being equal to the width of the high-potential coil 23 means that the width of the first outer circumferential line 96 falls within the range of ±20% of the width of the high-potential coil 23.

A first pitch between the first outer circumferential line 96 and the high-potential coil 23 (first transformer 21A) can be 0.1 μm or more but 5 μm or less. Preferably, the first pitch is 1 μm or more but 3 μm or less. Preferably, the first pitch is equal to the second winding pitch of the high-potential coil 23. The first pitch being equal to the second winding pitch means that the first pitch falls within the range of ±20% of the second winding pitch.

The second outer circumferential line 97 extends in the shape of a strip along the circumference of the high-potential coil 23 of the second transformer 21B. In this embodiment, the second outer circumferential line 97 is formed in the shape of a ring that has an open end in the first region 89 as seen in a plan view. The width of the open end of the second outer circumferential line 97 is smaller than the width of the high-potential coil 23 along the second direction Y. The open end of the second outer circumferential line 97 faces the open end of the first outer circumferential line 96 along the first direction X.

The width of the second outer circumferential line 97 can be 0.1 μm or more but 5 m or less. Preferably, the width of the second outer circumferential line 97 is 1 μm or more but 3 μm or less. The width of the second outer circumferential line 97 is defined by its width in the direction perpendicular to the direction in which the second outer circumferential line 97 extends. Preferably, the width of the second outer circumferential line 97 is equal to the width of the high-potential coil 23. The width of the second outer circumferential line 97 being equal to the width of the high-potential coil 23 means that the width of the second outer circumferential line 97 falls within the range of ±20% of the width of the high-potential coil 23.

A second pitch between the second outer circumferential line 97 and the high-potential coil 23 (second transformer 21B) can be 0.1 μm or more but 5 μm or less. Preferably, the second pitch is 1 μm or more but 3 μm or less. Preferably, the second pitch is equal to the second winding pitch of the high-potential coil 23. The second pitch being equal to the second winding pitch means that the second pitch falls within the range of ±20% of the second winding pitch.

The plurality of first middle lines 98 extend in the shape of strips in a region between the first and second outer circumferential line 96 and 97 in the first region 89. The plurality of first middle lines 98 includes at least one (in this embodiment, one) first connection line 99 that electrically connects together the first and second outer circumferential line 96 and 97.

To prevent formation of a loop circuit of current, preferably, the plurality of first middle lines 98 include only one first connection line 99. The first connection line 99 can be located at any place. In at least one of the plurality of first middle lines 98, a slit 100 is formed to cut off a loop circuit of current. The slit 100 is located at a place adjusted appropriately to suit the design of the plurality of the first middle lines 98.

Preferably, the plurality of first middle lines 98 are formed in the shape of strips extending along the direction in which the plurality of high-potential coils 23 face each other. In this embodiment, the plurality of first middle lines 98 are each formed in the shape of a strip extending in the first direction X, and are formed at intervals from each other in the second direction Y. The plurality of first middle lines 98 are formed, as a whole as seen in a plan view, in the shape of stripes extending in the first direction X.

Specifically, the plurality of first middle lines 98 include a plurality of first lead parts 101 and a plurality of second lead parts 102. The plurality of first lead parts 101 are led in the shape of stripes from the first outer circumferential line 96 toward the second outer circumferential line 97. Tip parts of the plurality of first lead parts 101 are formed at an interval from the first outer circumferential line 96 toward the second outer circumferential line 97.

The plurality of second lead parts 102 are lead in the shape of stripes from the second outer circumferential line 97 toward the first outer circumferential line 96. Tip parts of the plurality of second lead parts 102 are formed at an interval from the second outer circumferential line 97 toward the first outer circumferential line 96. In this embodiment, the plurality of second lead parts 102 are formed so as to sandwich one first lead part 101 at a place, alternating with the plurality of first lead parts 101 at intervals from each other in the second direction Y.

The plurality of second lead parts 102 can be formed so as to sandwich a plurality of first lead parts 101 at a place. Or a group of a plurality of second lead parts 102 can be formed to be adjacent to a group of a plurality of first lead parts 101. The slit 100, the plurality of first lead parts 101, and the plurality of second lead parts 102 suppress formation of a loop circuit of current in the first pattern 93.

The width of the first middle line 98 with respect to the second direction Y can be 0.1 μm or more but 5 μm or less. Preferably, the width of the first middle line 98 is 1 m or more but 3 μm or less. Preferably, the width of the first middle line 98 is equal to the width of the high-potential coil 23. The width of the first middle line 98 being equal to the width of the high-potential coil 23 means that the width of the first middle line 98 falls within the range of ±20% of the width of the high-potential coil 23.

Preferably, a third pitch between two adjacent first middle lines 98 is 0.1 μm or more but 5 μm or less. The third pitch is defined by the distance, with respect to the second direction Y, between a plurality of adjacent first middle lines 98. Preferably, the third pitch is equal everywhere. The third pitch being equal everywhere means that a third pitch at any place falls within the range of ±20% of that third pitch. Preferably, the third pitch is equal to the second winding pitch of the high-potential coil 23. The third pitch being equal to the second winding pitch means that the third pitch falls within the range of ±20% of the second winding pitch.

Referring to FIGS. 6 and 10, the second pattern 94 is electrically connected via the first high-potential wiring 33 to the high-potential terminal 12. In this embodiment, the second pattern 94 is electrically connected via the second outer circumferential line 97 of the first pattern 93 to the first high-potential wiring 33 (fifth high-potential terminal 12E). The second pattern 94 is patterned in dense lines so as to cover and hide the second region 90.

The second pattern 94 includes the second outer circumferential line 97 described above, a third outer circumferential line 103, and a plurality of second middle lines 104. The third outer circumferential line 103 extends in the shape of a strip along the circumference of the high-potential coil 23 of the third transformer 21C. In this embodiment, the third outer circumferential line 103 is formed in the shape of a ring with an open end in the third region 91 as seen in a plan view. The width of the open end of the third outer circumferential line 103 is smaller than the width of the high-potential coil 23 of the third transformer 21C along the second direction Y.

The width of the third outer circumferential line 103 can be 0.1 μm or more but 5 m or less. Preferably, the width of the third outer circumferential line 103 is 1 μm or more but 3 μm or less. The width of the third outer circumferential line 103 is defined by its width in the direction perpendicular to the direction in which the third outer circumferential line 103 extends. Preferably, the width of the third outer circumferential line 103 is equal to the width of the high-potential coil 23. The width of the third outer circumferential line 103 being equal to the width of the high-potential coil 23 means that the width of the third outer circumferential line 103 falls within the range of ±20% of the width of the high-potential coil 23.

A fourth pitch between the third outer circumferential line 103 and the high-potential coil 23 (third transformer 21C) can be 0.1 μm or more but 5 μm or less. Preferably, the fourth pitch is 1 μm or more but 3 μm or less. Preferably, the fourth pitch is equal to the second winding pitch of the high-potential coil 23. The fourth pitch being equal to the second winding pitch means that the fourth pitch falls within the range of ±20% of the second winding pitch.

The plurality of second middle lines 104 extend in the shape of strips in a region between the second and third outer circumferential lines 97 and 103 in the second region 90. The plurality of second middle lines 104 include at least one (in this embodiment, one) second connection line 105 that electrically connects together the second and third outer circumferential lines 97 and 103.

To prevent formation of a loop circuit of current, preferably, the plurality of second middle lines 104 include only one second connection line 105. The second connection line 105 can have a width larger than the width of the other second middle lines 104. The second connection line 105 can be located at any place. In at least one of the plurality of second middle lines 104, a slit 106 is formed to cut off a loop circuit of current. The slit 106 is located at a place adjusted appropriately to suit the design of the plurality of the second middle lines 104.

Preferably, the plurality of second middle lines 104 are formed in the shape of strips extending along the direction in which the plurality of high-potential coils 23 face each other. In this embodiment, the plurality of second middle lines 104 are each formed in the shape of a strip extending in the first direction X, and are formed at intervals from each other in the second direction Y. The plurality of second middle lines 104 are formed, as a whole as seen in a plan view, in the shape of stripes extending in the first direction X.

Specifically, the plurality of second middle lines 104 includes a plurality of third lead parts 107 and a plurality of fourth lead parts 108. The plurality of third lead parts 107 are led in the shape of stripes from the second outer circumferential line 97 toward the third outer circumferential line 103. Tip parts of the plurality of third lead parts 107 are formed at an interval from the third outer circumferential line 103 toward the second outer circumferential line 97.

The plurality of fourth lead parts 108 are lead from the circumferential line 103 toward the second outer circumferential line 97. Tip parts of the plurality of fourth lead parts 108 are formed at an interval from the second outer circumferential line 97 toward the third outer circumferential line 103. In this embodiment, the plurality of fourth lead parts 108 are formed so as to sandwich one third lead part 107 at a place, alternating with the plurality of third lead parts 107 at intervals from each other in the second direction Y.

The plurality of fourth lead parts 108 can be formed so as to sandwich a plurality of third lead parts 107 at a place. Or a group of a plurality of fourth lead parts 108 can be formed to be adjacent to a group of a plurality of third lead parts 107. The slit 106, the plurality of third lead parts 107, and the plurality of fourth lead parts 108 suppress formation of a loop circuit of current in the second pattern 94.

The width of the second middle line 104 with respect to the second direction Y can be 0.1 μm or more but 5 μm or less. Preferably, the width of the second middle line 104 is 1 μm or more but 3 μm or less. Preferably, the width of the second middle line 104 is equal to the width of the high-potential coil 23. The width of the second middle line 104 being equal to the width of the high-potential coil 23 means that the width of the second middle line 104 falls within the range of ±20% of the width of the high-potential coil 23.

Preferably, a fifth pitch between two adjacent second middle lines 104 is 0.1 μm or more but 5 μm or less. Preferably, the fifth pitch is 1 μm or more but 3 μm or less.

The fifth pitch is defined by the distance, with respect to the second direction Y, between a plurality of adjacent second middle lines 104. Preferably, the fifth pitch is equal everywhere. The fifth pitch being equal everywhere means that a fifth pitch at any place falls within the range of ±20% of that fifth pitch. Preferably, the fifth pitch is equal to the second winding pitch of the high-potential coil 23. The fifth pitch being equal to the second winding pitch means that the fifth pitch falls within the range of ±20% of the second winding pitch.

Referring to FIGS. 6 and 11, the third pattern 95 is electrically connected to the first high-potential wiring 33. In this embodiment, the third pattern 95 is electrically connected via the second pattern 94 and the first pattern 93 to the first high-potential wiring 33. The third pattern 95 is patterned in dense lines so as to cover and hide part of the third region 91. The third pattern 95 is formed in the third region 91 at an interval from the high-potential terminal 12 (sixth high-potential terminal 12F) as seen in a plan view, and does not face the high-potential terminal 12 in the normal direction Z.

The third pattern 95 is formed at an interval from the low-potential connection wiring 72 as seen in a plan view, and does not face the low-potential connection wiring 72 in the normal direction Z. This results in an increased insulation distance between the third pattern 95 and the low-potential connection wiring 72 and gives the insulation layer 51 an increased dielectric strength voltage.

The third pattern 95 includes the third outer circumferential line 103 described above, a fourth outer circumferential line 109, and a plurality of third middle lines 110. The fourth outer circumferential line 109 extends in the shape of a strip along the circumference of the high-potential coil 23 of the fourth transformer 21D. In this embodiment, the fourth outer circumferential line 109 is formed in the shape of a ring with an open end in the third region 91 as seen in a plan view. The width of the open end of the fourth outer circumferential line 109 is smaller than the width of the high-potential coil 23 of the fourth transformer 21D along the second direction Y. The open end of the fourth outer circumferential line 109 faces the open end of the third outer circumferential line 103 along the first direction X.

The width of the fourth outer circumferential line 109 can be 0.1 μm or more but 5 m or less. Preferably, the width of the fourth outer circumferential line 109 is 1 μm or more but 3 μm or less. The width of the fourth outer circumferential line 109 is defined by its width in the direction perpendicular to the direction in which the fourth outer circumferential line 109 extends. Preferably, the width of the fourth outer circumferential line 109 is equal to the width of the high-potential coil 23. The width of the fourth outer circumferential line 109 being equal to the width of the high-potential coil 23 means that the width of the fourth outer circumferential line 109 falls within the range of ±20% of the width of the high-potential coil 23.

A sixth pitch between the fourth outer circumferential line 109 and the high-potential coil 23 (fourth transformer 21D) can be 0.1 μm or more but 5 μm or less. Preferably, the sixth pitch is 1 μm or more but 3 μm or less. Preferably, the sixth pitch is equal to the second winding pitch of the high-potential coil 23. The sixth pitch being equal to the second winding pitch means that the sixth pitch falls within the range of ±20% of the second winding pitch.

The plurality of third middle lines 110 extend in the shape of strips in a region between the third and fourth outer circumferential lines 103 and 109 in the third region 91. The plurality of third middle lines 110 include at least one (in this embodiment, one) third connection line 111 that electrically connects together the third and fourth outer circumferential lines 103 and 109.

To prevent formation of a loop circuit of current, preferably, the plurality of third middle lines 110 include only one third connection line 111. The third connection line 111 can be located at any place. In at least one of the plurality of third middle lines 110, a slit 112 is formed to cut off a loop circuit of current. The slit 112 is located at a place adjusted appropriately to suit the design of the plurality of the third middle lines 110.

Preferably, the plurality of third middle lines 110 are formed in the shape of strips extending along the direction in which the plurality of high-potential coils 23 face each other. In this embodiment, the plurality of third middle lines 110 are each formed in the shape of a strip extending in the first direction X, and are formed at intervals from each other in the second direction Y. The plurality of third middle lines 110 are formed, as a whole as seen in a plan view, in the shape of stripes.

In this embodiment, the plurality of third middle lines 110 includes a plurality of fifth lead parts 113 and a plurality of sixth lead parts 114. The plurality of fifth lead parts 113 are led in the shape of stripes from the third outer circumferential line 103 toward the fourth outer circumferential line 109. Tip parts of the plurality of fifth lead parts 113 are formed at an interval from the fourth outer circumferential line 109 toward the third outer circumferential line 103.

The plurality of sixth lead parts 114 are lead in the shape of stripes from the fourth outer circumferential line 109 toward the third outer circumferential line 103. Tip parts of the plurality of sixth lead parts 114 are formed at an interval from the third outer circumferential line 103 toward the fourth outer circumferential line 109. In this embodiment, the plurality of sixth lead parts 114 are formed so as to sandwich one fifth lead part 113 at a place, alternating with the plurality of fifth lead parts 113 at intervals from each other in the second direction Y.

The plurality of sixth lead parts 114 can be formed so as to sandwich a plurality of fifth lead parts 113 at a place. Or a group of a plurality of sixth lead parts 114 can be formed to be adjacent to a group of a plurality of fifth lead parts 113. The slit 112, the plurality of fifth lead parts 113, and the plurality of sixth lead parts 114 suppress formation of a loop circuit of current in the third pattern 95.

The width of the third middle line 110 with respect to the second direction Y can be 0.1 μm or more but 5 μm or less. Preferably, the width of the third middle line 110 is 1 m or more but 3 μm or less. Preferably, the width of the third middle line 110 is equal to the width of the high-potential coil 23. The width of the third middle line 110 being equal to the width of the high-potential coil 23 means that the width of the third middle line 110 falls within the range of ±20% of the width of the high-potential coil 23.

A seventh pitch between two adjacent third middle lines 110 can be 0.1 μm or more but 5 μm or less. Preferably, the seventh pitch is 1 μm or more but 3 μm or less. The seventh pitch is defined by the distance, with respect to the second direction Y, between a plurality of adjacent third middle lines 110. Preferably, the seventh pitch is equal everywhere. The seventh pitch being equal everywhere means that a seventh pitch at any place falls within the range of ±20% of that seventh pitch. Preferably, the seventh pitch is equal to the second winding pitch of the high-potential coil 23. The seventh pitch being equal to the second winding pitch means that the seventh pitch falls within the range of ±20% of the second winding pitch.

Referring to FIGS. 6 to 11, in this embodiment, the second high-potential dummy pattern 88 is electrically connected via the first high-potential dummy pattern 87 to the high-potential terminal 12. Specifically, the second high-potential dummy pattern 88 includes a second connection part 115 that is connected to the first high-potential dummy pattern 87. The second connection part 115 can be located at any place. Thus, the second high-potential dummy pattern 88 is fixed at the same potential as the plurality of high-potential coils 23.

In the first, second, and third regions 89, 90, and 91, the second high-potential dummy pattern 88 suppresses electric fields that leak upward from the high-potential coil 23 and suppresses electric field concentration on the plurality of high-potential coils 23. In this embodiment, the second high-potential dummy pattern 88 surrounds an entire region including the plurality of high-potential coils 23 and the plurality of high-potential terminals 12A to 12F. In this embodiment, the second high-potential dummy pattern 88 is formed in the shape of an elongate ring (elliptical ring) as seen in a plan view.

Thus, the second high-potential dummy pattern 88 lies in a region between the plurality of low-potential terminals 11A to 11F and the plurality of high-potential terminals 12A to 12F. Moreover, the second high-potential dummy pattern 88 lies in a region between the plurality of low-potential terminals 11A to 11F and the plurality of high-potential terminals 12A to 12F as seen in a plan view.

The second high-potential dummy pattern 88 includes a plurality of (in this embodiment, six) high-potential lines 116A, 116B, 116C, 116D, 116E, and 116F. Any number of high-potential lines can be provided, which is adjusted according to the electric field strength to be attenuated. The plurality of high-potential lines 116A to 116F are formed in this order at intervals from each other in the direction away from the plurality of high-potential coils 23.

The plurality of high-potential lines 116A to 116F surround the plurality of high-potential coils 23 entirely as seen in a plan view. Specifically, the plurality of high-potential lines 116A to 116F surround an entire region including the plurality of high-potential coils 23 and the plurality of high-potential terminals 12A to 12F as seen in a plan view. In this embodiment, the plurality of high-potential lines 116A to 116F are formed in the shape of an elongate ring (elliptical ring) as seen in a plan view.

The plurality of high-potential lines 116A to 116F each include a slit 117 for cutting off a loop circuit of current. The slit 117 is located at a place adjusted appropriately according to the design of the plurality of high-potential lines 116A to 116F.

The width of the high-potential line 116A to 116F can be 0.1 μm or more but 5 m or less. Preferably, the width of the high-potential line 116A to 116F is 1 μm or more but 3 μm or less. The width of the high-potential line 116A to 116F is defined by its width in the direction perpendicular to the direction in which the high-potential line 116A to 116F extends. Preferably, the width of the high-potential line 116A to 116F is equal to the width of the high-potential coil 23. The width of the high-potential line 116A to 116F being equal to the width of the high-potential coil 23 means that the width of the high-potential line 116A to 116F falls within the range of ±20% of the width of the high-potential coil 23.

An eighth pitch between two adjacent high-potential lines 116A to 116F can be 0.1 μm or more but 5 μm or less. Preferably, the eighth pitch is 1 μm or more but 3 μm or less. Preferably, the eighth pitch is equal everywhere. The eighth pitch being equal everywhere means that an eighth pitch at any place falls within the range of ±20% of that eighth pitch.

A ninth pitch between a first high-potential dummy pattern 87 and a second high-potential dummy pattern 88 that are adjacent to each other can be 0.1 μm or more but 5 m or less. Preferably, the ninth pitch is 1 μm or more but 3 μm or less. Preferably, the ninth pitch is equal to the second winding pitch of the high-potential coil 23. The ninth pitch being equal to the second winding pitch means that the ninth pitch falls within the range of ±20% of the second winding pitch. The plurality of high-potential lines 116A to 116F can be provided in any number and with any width, pitch, and the like, which are adjusted according to the electric field strength to be attenuated.

Referring to FIGS. 6 to 11, the dummy pattern 85 includes a floating dummy pattern 121 that is formed in an electrically floating state in the insulation layer 51 so as to be located around the transformers 21A to 21D as seen in a plan view. The floating dummy pattern 121 is formed in a pattern different (discontinuous) from that of either of the high- and low-potential coils 23 and 22, and is independent of the transformers 21A to 21D. That is, the dummy pattern floating dummy pattern 121 does not function as part of the transformers 21A to 21D.

In the embodiment, the floating dummy pattern 121 is patterned in dense lines so as to partly cover and partly expose a region around the high-potential coil 23 as seen in a plan view. The floating dummy pattern 121 can be formed so as to have ends or no ends.

The floating dummy pattern 121 is patterned at a line density per unit area that is equal to the line density of the high-potential coil 23. The line density of the floating dummy pattern 121 being equal to the line density of the high-potential coil 23 means that the line density of the floating dummy pattern 121 falls within the range of ±20% of the line density of the high-potential coil 23.

The floating dummy pattern 121 is patterned at a line density per unit area that is equal to the line density of the high-potential dummy pattern 86. The line density of the floating dummy pattern 121 being equal to the line density of the high-potential dummy pattern 86 means that the line density of the floating dummy pattern 121 falls within the range of ±20% of the line density of the high-potential dummy pattern 86.

The floating dummy pattern 121 shields electric fields between the low- and high-potential coils 22 and 23 in the transformers 21A to 21D to suppress electric field concentration on the high-potential coil 23. Specifically, the floating dummy pattern 121 disperses electric fields that leak upward from the high-potential coil 23 away from the high-potential coil 23. In this way, electric field concentration on the high-potential coil 23 is suppressed.

The floating dummy pattern 121 also disperses electric fields that leak upward from the high-potential dummy pattern 86 around the high-potential dummy pattern 86 away from the high-potential coil 23 and the high-potential dummy pattern 86. In this way, electric field concentration on the high-potential dummy pattern 86 is suppressed, and also electric field concentration on the high-potential coil 23 is suppressed properly.

The floating dummy pattern 121 can be formed at any depth in the insulation layer 51, which is adjusted according to the electric field strength to be attenuated. Preferably, the floating dummy pattern 121 is formed in a region closer to the high-potential coil 23 than to the low-potential coil 22 with respect to the normal direction Z. The floating dummy pattern 121 being closer to the high-potential coil 23 with respect to the normal direction Z means that the distance between the floating dummy pattern 121 and the high-potential coil 23 with respect to the normal direction Z is smaller than the distance between the floating dummy pattern 121 and the low-potential coil 22.

In that way, electric field concentration on the high-potential coil 23 can be suppressed properly. The smaller the distance between the floating dummy pattern 121 and the high-potential coil 23 with respect to the normal direction Z, the more effectively electric field concentration on the high-potential coil 23 can be suppressed. Preferably, the floating dummy pattern 121 is formed in the same interlayer insulation layer 57 as the high-potential coil 23. In that way, electric field concentration on the high-potential coil 23 can be suppressed more properly.

Preferably, the floating dummy pattern 121 lies in a region between the low-potential terminal 11 and the high-potential coil 23 as seen in a plan view. In that way, unwanted conduction between the low-potential terminal 11 and the high-potential coil 23 resulting from electric field concentration on the high-potential coil 23 can be suppressed. Preferably, the floating dummy pattern 121 lies in a region between the low- and high-potential terminals 11 and 12 as seen in a plan view. In that way, unwanted conduction between the low- and high-potential terminals 11 and 12 resulting from electric field concentration on the high-potential coil 23 can be suppressed.

In this embodiment, the floating dummy pattern 121 is formed along the plurality of high-potential coils 23 as seen in a plan view. Specifically, the floating dummy pattern 121 surrounds an entire region including the plurality of high-potential coils 23 and the plurality of high-potential terminals 12 as seen in a plan view. In this embodiment, the floating dummy pattern 121 surrounds, across the high-potential dummy pattern 86 (second high-potential dummy pattern 88), an entire region including the plurality of high-potential coils 23 and the plurality of high-potential terminals 12 as seen in a plan view.

Thus, the floating dummy pattern 121 lies in a region between the plurality of low-potential terminals 11A to 11F and the plurality of high-potential coils 23 as seen in a plan view. Moreover, the floating dummy pattern 121 lies in a region between the plurality of low-potential terminals 11A to 11F and the plurality of high-potential terminals 12A to 12F as seen in a plan view.

Any number of floating lines can be provided, which is adjusted according to the electric field strength to be attenuated. In this embodiment, the floating dummy pattern 121 includes a plurality of (in the diagram, six) floating lines 122A, 122B, 122C, 122D, 122E, and 122F. The plurality of floating lines 122A to 122F are formed in this order at intervals from each other in the direction away from the plurality of high-potential coils 23.

The plurality of floating lines 122A to 122F surround the plurality of high-potential coils 23 entirely as seen in a plan view. Specifically, the plurality of floating lines 122A to 122F surround, across the high-potential dummy pattern 86, an entire region including the plurality of high-potential coils 23 and the plurality of high-potential terminals 12A to 12F as seen in a plan view. In this embodiment, the plurality of floating lines 122A to 122F are formed in the shape of an elongate ring (elliptical ring) as seen in a plan view.

The width of the floating line 122A to 122F can be 0.1 μm or more but 5 μm or less. Preferably, the width of the floating line 122A to 122F is 1 μm or more but 3 μm or less. The width of the floating line 122A to 122F is defined by its width in the direction perpendicular to the direction in which the floating line 122A to 122F extends.

A tenth pitch between two adjacent floating lines 122A to 122F can be 0.1 μm or more but 5 μm or less. Preferably, the tenth pitch is 1 μm or more but 3 μm or less. Preferably, the width of the floating line 122A to 122F is equal to the width of the high-potential coil 23. The width of the floating line 122A to 122F being equal to the width of the high-potential coil 23 means that the width of the floating line 122A to 122F falls within the range of ±20% of the width of the high-potential coil 23.

An eleventh pitch between the floating dummy pattern 121 and the high-potential dummy pattern 86 (second high-potential dummy pattern 88) can be 0.1 μm or more but m or less. Preferably, the eleventh pitch is 1 μm or more but 3 μm or less. Preferably, the eleventh pitch is equal everywhere. The eleventh pitch being equal everywhere means that an eleventh pitch at any place falls within the range of ±20% of that eleventh pitch.

Preferably, the eleventh pitch is equal to the second winding pitch of the high-potential coil 23. The eleventh pitch being equal to the second winding pitch means that the eleventh pitch falls within the range of ±20% of the second winding pitch.

Preferably, a twelfth pitch between the floating dummy pattern 121 and the high-potential dummy pattern 86 is equal to the second winding pitch. The twelfth pitch being equal to the second winding pitch means that the twelfth pitch falls within the range of ±20% of the second winding pitch. The plurality of floating lines 122A to 122F can be provided in any number and with any width, pitch, and the like, which are adjusted according to the electric field strength to be attenuated.

Referring to FIGS. 7 and 8, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIGS. 7 and 8, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 7 and 8, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a strip along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Referring to FIGS. 7, 8, and 12, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a strip along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIGS. 7 and 8, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 μm or more but 50 μm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 μm or more but 10 μm or less. Preferably, the organic insulation layer 145 has a thickness of 5 μm or more but 50 m or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

Without the organic insulation layer 145, a filler contained in a package body 2 (molding resin) may cause damage to the plurality of high-potential coils 23, the plurality of high-potential terminals 12, the sealing conductor 61, the first high-potential dummy pattern 87, the second high-potential dummy pattern 88, and the floating dummy pattern 121. This type of damage is called filler attack.

The organic insulation layer 145 protects from the filler contained in the package body 2 (molding resin) the plurality of high-potential coils 23, the plurality of high-potential terminals 12, the sealing conductor 61, the first high-potential dummy pattern 87, the second high-potential dummy pattern 88, and the floating dummy pattern 121. The slit between the first and second parts 146 and 147 functions as an anchor portion with respect to the package body 2 (molding resin).

A part of the package body 2 (molding resin) lodges in the slit between the first and second parts 146 and 147 and is connected to the inorganic insulation layer 140. This increases the strength of the attachment of the package body 2 (molding resin) to the semiconductor device 5. Needless to say, the first and second parts 146 and 147 may be formed integrally. Or the organic insulation layer 145 may include only either the first or second part 145 or 146. In that case, however, care has to be taken to filler attack.

The present disclosure can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 13:
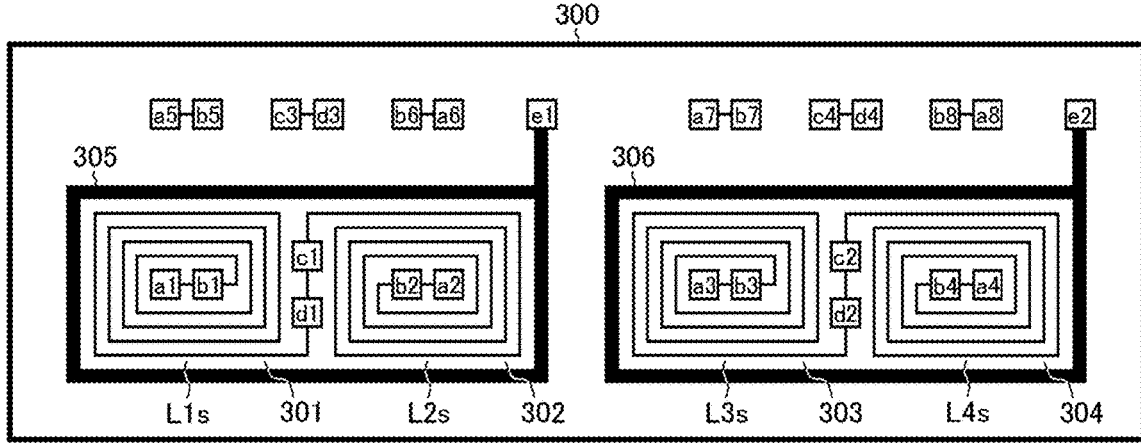
FIG. 13 is a diagram schematically showing an example of the layout of a transformer chip.

FIG. 13 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1s of the first transformer 301, and the pads c1 and d1 are connected to the other terminal of that secondary coil L1s. The pads a2 and b2 are connected to one terminal of the secondary coil L2s of the second transformer 302, and the pads c1 and d1 are connected to the other terminal of that secondary coil L2s.

Moreover, the pads a3 and b3 are connected to one terminal of the secondary coil L3s of the third transformer 303, and the pads c2 and d2 are connected to the other terminal of that secondary coil L3s. The pads a4 and b4 are connected to one terminal of the secondary coil L4s of the fourth transformer 304, and the pads c2 and d2 are connected to the other terminal of that secondary coil L4s.

FIG. 13 does not show any of the primary coils L1p, L2p, L3p, and L4p that constitute the first, second, third, and fourth transformers 301, 302, 303, and 304 respectively. The primary coils Lip to L4p basically have structures similar to those of the secondary coils L1s to L4s respectively, and are disposed right below the secondary coils L1s to L4s, respectively, so as to face them.

Specifically, the pads a5 and b5 are connected to one terminal of the primary coil Lip of the first transformer 301, and the pads c3 and d3 are connected to the other terminal of that primary coil Lip. Likewise, the pads a6 and b6 are connected to one terminal of the primary coil L2p of the second transformer 302, and the pads c3 and d3 are connected to the other terminal of that primary coil L2p.

Likewise, the pads a7 and b7 are connected to one terminal of the primary coil L3p of the third transformer 303, and the pads c4 and d4 are connected to the other terminal of that primary coil L3p. Likewise, the pads a8 and b8 are connected to one terminal of the primary coil L4p of the fourth transformer 304, and the pads c4 and d4 are connected to the other terminal of that primary coil L4p.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad;

the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 13, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1s and L2s. The pads c2 and d2 are shared between the secondary coils L3s and L4s. The pads c3 and d3 are shared between the primary coils Lip and L2p. The pads c4 and d4 are shared between the primary coils L3p and L4p. This configuration helps reduce the number of pads and helps make the transformer chip 300 compact.

Moreover, as shown in FIG. 13, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.
<Gate Driver (First Embodiment)>

Figure 14:
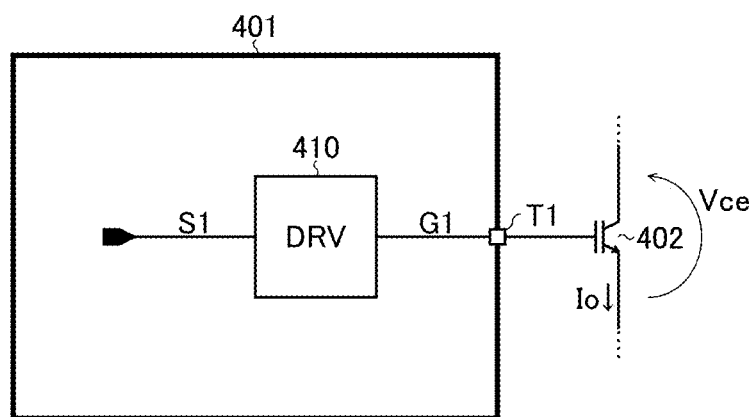
FIG. 14 is a diagram showing a gate driver according to a first embodiment (comparative example)

FIG. 14 is a diagram showing a gate driver according to a first embodiment (a comparative example to be compared with the second embodiment described later). The gate driver 401 of the first embodiment is a semiconductor device having integrated in it a gate driving circuit 410 for driving a power device 402 (in the diagram, an n-channel IGBT). The gate driver 401 corresponds to the signal transmission device 200 described previously. The gate driving circuit 410 corresponds to the driver 224 described previously.

The gate driving circuit 410 generates a gate driving signal G1 for the power device 402 according to a gate control signal S1, and feeds the gate driving signal G1 via an external terminal T1 to the gate of the power device 402. For example, in a case where the power device 402 is of the n-channel type, when the gate driving signal G1 is at high level, the power device 402 is on and, when the gate driving signal G1 is at low level, the power device 402 is off.

Figure 15:
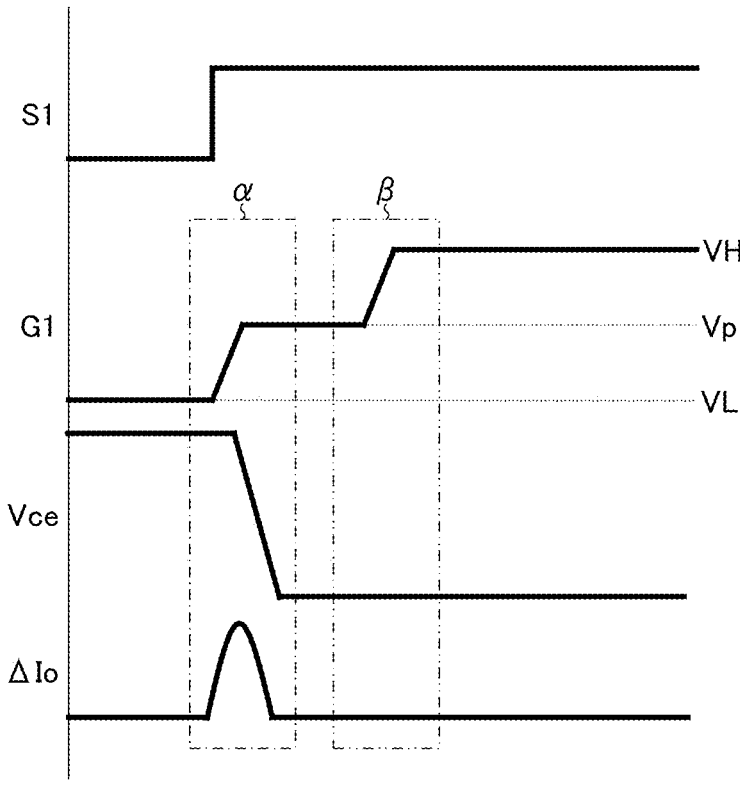
FIG. 15 is a diagram showing the gate driving operation in the first embodiment (comparative example).

FIG. 15 is a diagram showing the gate driving operation in the first embodiment (comparative example), depicting, from top down, the gate control signal S1, the gate driving signal G1, the collector-emitter voltage Vce of the power device 402, and the variation $\Delta$Io of the output current Jo through the power device 402.

As shown in the diagram, when the gate control signal S1 rises from low level to high level, the gate driving signal G1 too rises from low level (VL) to high level (VH). As a result, the power device 402 turns from off to on; thus the output current Jo passes and the collector-emitter voltage Vce of the power device 402 falls.

More specifically, when the gate driving signal G1 becomes higher than the on threshold voltage of the power device 402, the output current Jo starts to increase ($\Delta$Io>0). After that, when the gate driving signal G1 becomes close to the plateau voltage Vp, the output current Jo stops increasing, and the collector-emitter voltage Vce of the power device 402 starts to fall. Here, the plateau voltage Vp is the gate voltage value at which a mirror capacitance starts to be charged or discharged during the switching of the power device 402.

In the diagram, region $\alpha$ is a region mainly associated with the generation of a surge and noise; region $\beta$ is a region mainly associated with switching loss. This means that, by driving the power device 402 slowly in region $\alpha$ and fast in region 3, it is possible to both reduce surges and noise and suppress switching loss.

Inconveniently, the rising speed and the plateau voltage Vp of the gate driving signal G1 vary greatly depending on the type, manufacturing variation, junction temperature, and the like of the power device 402. To cope with that, presented below will be a novel embodiment of the gate driver 401 that can switch its gate driving capacity actively by monitoring the state of the power device 402.
<Gate Driver (Second Embodiment)>

Figure 16:
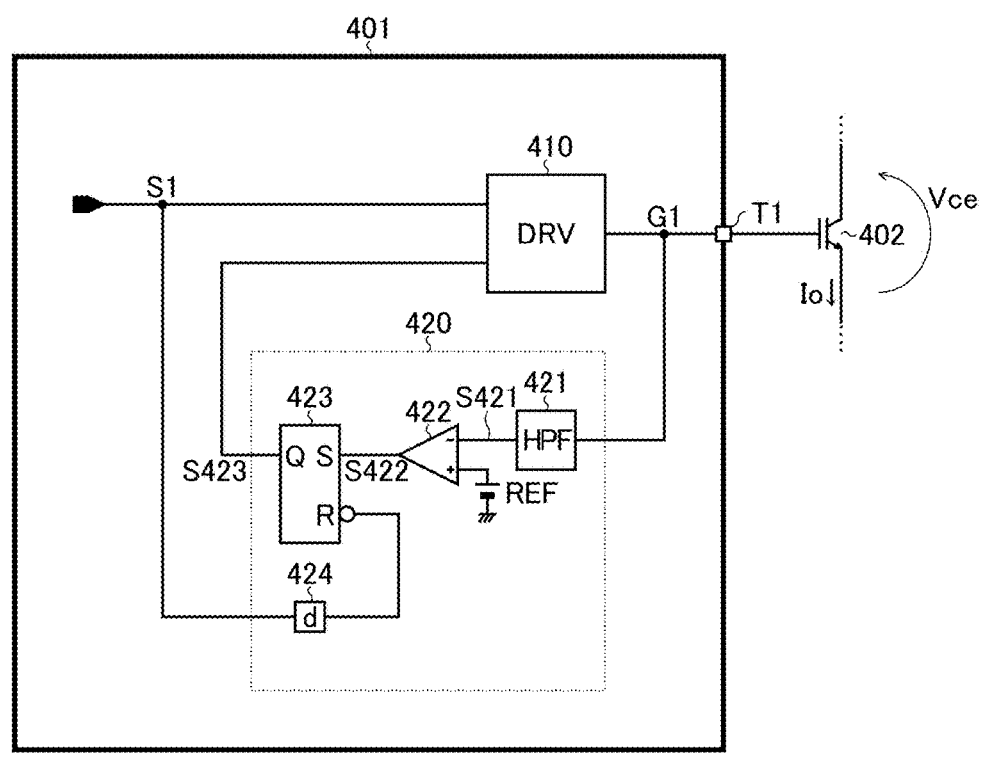
FIG. 16 is a diagram showing a gate driver according to a second embodiment.

FIG. 16 is a diagram showing a gate driver according to a second embodiment. The gate driver 401 of the second embodiment is based on the first embodiment (FIG. 14) described previously and further includes a driving capacity switch circuit 420. The gate driving circuit 410 and the driving capacity switch circuit 420 are both integrated in the gate driver 401 (i.e., semiconductor device).

The driving capacity switch circuit 420 includes a high-pass filter 421, a comparator 422, a latch 423, and a delay circuit 424.

The high-pass filter 421 extracts from the gate driving signal G1 components of frequencies higher than the cutoff frequency fc to generate a time-variation signal S421 (corresponding to the variation of the gate driving signal G1 per unit time). The time-variation signal S421 can be understood to be a differentiated signal of the gate driving signal G1.

The comparator 422 compares the time-variation signal S421, which is fed to the inverting input terminal (−) of the comparator 422, with a threshold value REF, which is fed to the non-inverting input terminal (+) of the comparator 422, to generate a comparison signal S422. Accordingly, the comparison signal S422 is at low level when S421>REF, and is at high level when S421<REF. The threshold value REF can be a variable value that can be adjusted freely by use of an external signal, a non-volatile memory, or the like.

The latch 423 receives the gate control signal S1 and the comparison signal S422 to generate a driving capacity switch signal S423 for the gate driving circuit 410. Suitably usable as the latch 423 is an RS flip-flop that sets the driving capacity switch signal S423 to high level when the comparison signal S422, which is fed to the set terminal (S) of the latch 423, rises to high level. In that case, the latch 423 can be configured to be in a reset state when the gate control signal S1, which is fed to the reset terminal (R) of the latch 423, is at low level (the logic level corresponding to an off state) and in a reset-released state when the gate control signal S1 is at high level (the logic level corresponding to an on state). With the latch 423 in the reset state, the driving capacity switch signal S423 is at low level.

The gate driving capacity of the gate driving circuit 410 can be set to, for example, a first driving capacity when the driving performance switch signal S423 is at low level and to a second driving capacity higher than the first driving capacity when the driving performance switch signal S423 is at high level.

The delay circuit 424 delays and then outputs the gate control signal S1 to the reset terminal (R) of the latch 423. Owing to this delay circuit 424, in the on-transition period of the power device 402, the latch 423 can be released from the reset state only after the comparison signal S422 drops to low level. This helps enhance the stability of the driving capacity switch operation.

Configured as described above, the driving capacity switch circuit 420 raises the gate driving capacity of the gate driving circuit 410 (i.e., its capacity to charge the gate capacitance of the power device 402) when the time-variation signal S421, which is obtained by passing the gate driving signal G1 in the on-transition period of the power device 402 through the high-pass filter 421, becomes lower than the threshold value REF. Now, with reference to the relevant drawings, the operation of the driving capacity switch circuit 420 will be described.

Figure 17:
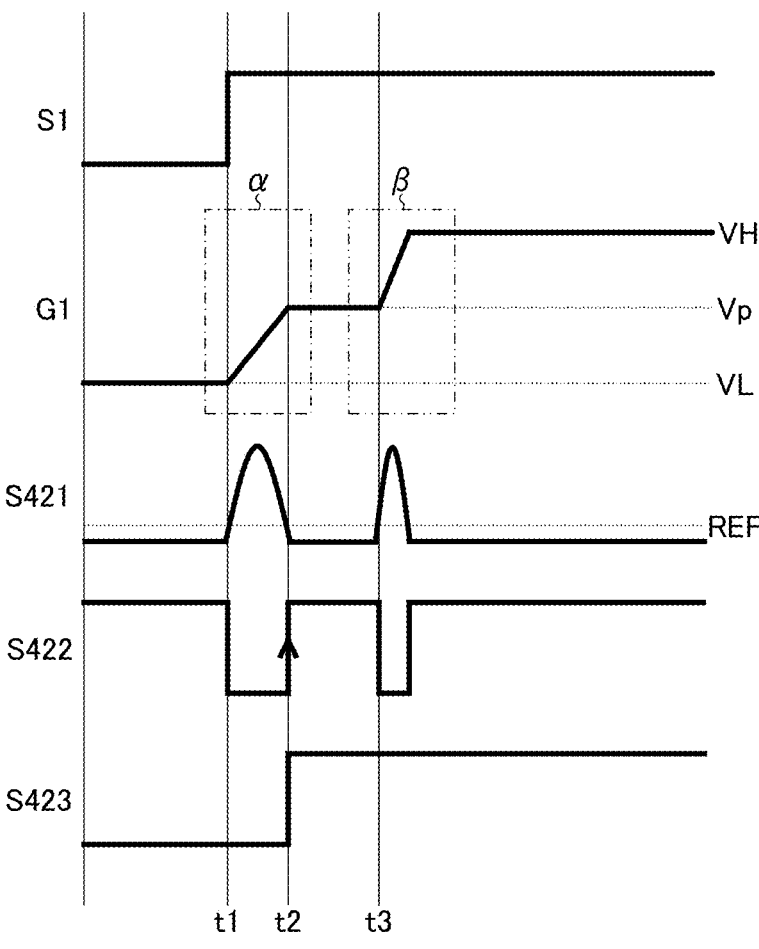
FIG. 17 is a diagram showing the gate driving operation in the second embodiment.

FIG. 17 is a diagram showing the gate driving operation (in particular, gate driving capacity switch operation) in the second embodiment, depicting, from top down, the gate control signal S1, the gate driving signal G1, the time-variation signal S421, the comparison signal S422, and the driving performance switch signal S423.

When at time point t1 the gate control signal S1 rises from low level to high level, the gate driving signal G1 starts to rise from low level (VL). Meanwhile, the time-variation signal S421 becomes higher than the threshold value REF, and thus the comparison signal S422 falls from high level to low level. As a result, the driving performance switch signal S423 is kept at low level, so that the gate driving capacity of the gate driving circuit 410 is set to the first driving capacity (slow). Accordingly, in the low-level period of the driving performance switch signal S423 (i.e., in the slow-driving period), with the first driving capacity, the gate driving signal G1 rises comparatively gently.

When at time point t2 the gate driving signal G1 becomes close to the plateau voltage Vp, the gate driving signal G1 ceases to rise and the time-variation signal S421 becomes lower than the threshold value REF; thus the comparison signal S422 rises from low level to high level. As a result, the driving performance switch signal S423 rises from low level to high level, to that the gate driving capacity of the gate driving circuit 410 is switched from the first driving capacity (slow) to the second driving capacity (fast). Accordingly, in the high-level period of the driving performance switch signal S423 (i.e., in the fast-driving period), with the second driving capacity, the gate driving signal G1 rises comparatively fast.

When at time point t3 the charging and discharging of the mirror capacity in the on-transition period of the power device 402 are complete, the gate driving signal G1 starts to rise again. This causes the time-variation signal S421 to vary and thus produces a pulse in the comparison signal S422. At this time point, however, since the driving performance switch signal S423 is already set to high level, the gate driving capacity of the gate driving circuit 410 continues to be the second driving capacity (fast).

With the sequence of gate driving operation (in particular, gate driving capacity switch operation) described above, it is possible to drive the power device 402 slowly in region α and drive it fast in region β. It is thus possible to both reduce surges and noise and suppress switching loss.

<High-Pass Filter>

Figure 18:
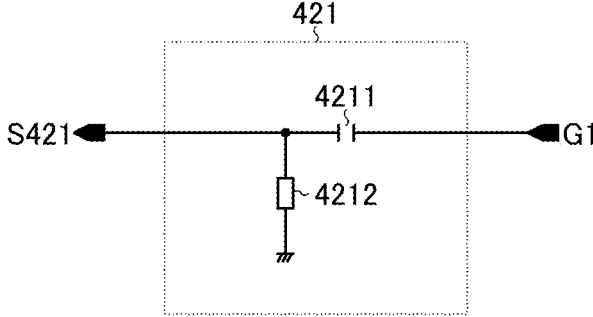
FIG. 18 is a diagram showing one configuration example of a high-pass filter.

FIG. 18 is a diagram showing one configuration example of the high-pass filter 421. The high-pass filter 421 of this configuration example includes a capacitor 4211 (with a capacitance value C) and a resistor 4212 (with a resistance value R).

The first terminal of the capacitor 4211 is connected to an application terminal for the gate driving signal G1. The second terminal of the capacitor 4211 and the first terminal of the resistor 4212 are both connected to an application terminal for the time-variation signal S421. The second terminal of the resistor 4212 is connected to a ground terminal. The cutoff frequency fc of the high-pass filter 421 is given by fc=1/(2πRC).

Using a first-order CR high-pass filter as the high-pass filter 421 in this way helps accomplish integration in a semiconductor device with no increase in circuit area. In particular, in view of integration in the gate driver 401, which is required to handle high current and high voltage, it is preferable to use a high-pass filter 421 as a means for detecting the time variation of the gate driving signal G1.

<Gate Driving Circuit>

Figure 19:
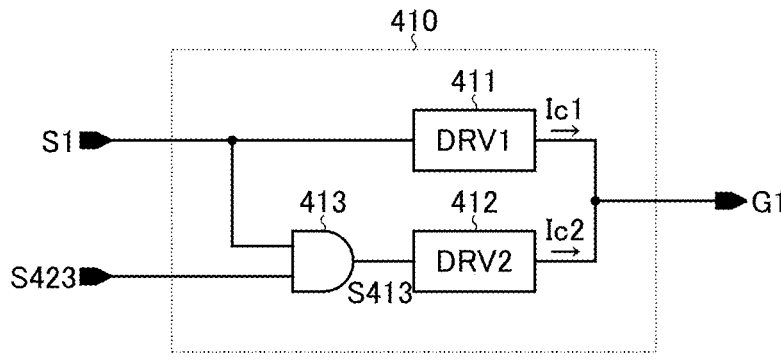
FIG. 19 is a diagram showing one configuration example of a gate driving circuit.

FIG. 19 is a diagram showing one configuration example of the gate driving circuit 410. The gate driving circuit 410 of this configuration example includes a first gate driver 411, a second gate driver 412, and a logic gate 413.

The first gate driver 411 outputs a charge current Ic1 toward the gate of the power device 402 when the gate control signal S1 is at high level.

The second gate driver 412 outputs a charge current Ic2 toward the gate of the power device 402 when an AND signal S413 is at high level.

The logic gate 413 generates the AND signal S413 between the gate control signal S1 and the driving performance switch signal S423. The AND signal S413 is at low level when at least either the gate control signal S1 or the driving performance switch signal S423 is at low level, and is at high level when the gate control signal S1 and the driving performance switch signal S423 are both at high level. That is, the logic gate 413 is configured to enable and disable the second gate driver 412 according to the driving performance switch signal S423 (corresponding an instruction from the driving capacity switch circuit 420).

In terms of what is shown in the diagram, in the on-transition period of the power device 402 (S1=H), when the driving performance switch signal S423 is at low level, the AND signal S413 is fixed at low level. Accordingly, while the first gate driver 411 outputs the charge current Ic1, the second gate driver 412 does not output the charge current Ic2. This state corresponds to a state where the gate driving capacity of the gate driving circuit 410 is set to the first driving capacity (slow) mentioned above.

On the other hand, in the on-transition period of the power device 402 (S1=H), when the driving performance switch signal S423 is at high level, the AND signal S413 is at high level. Thus, the first gate driver 411 outputs the charge current Ic1 and the second gate driver 412 too outputs the charge current Ic2. This state corresponds to a state where the gate driving capacity of the gate driving circuit 410 is set to the second driving capacity (fast).

While this configuration example deals with an example where, while the first gate driver 411 is kept enabled all the time, the second gate driver 412 is enabled and disabled according to the driving performance switch signal S423. In another possible configuration example, the first and second gate drivers 411 and 412 can be enabled and disabled individually and exclusively according to the driving performance switch signal S423.

Specifically, in region α mentioned above, the first gate driver 411 can be enabled and the second gate driver 412 disabled; on the other hand, in region β mentioned above, the first gate driver 411 can be disabled and the second gate driver 412 enabled. In that case, the driving capacity of the first gate driver 411 can be set to be lower than that of the second gate driver 412. For example, the first gate driver 411 can be given a higher impedance than the second gate driver 412 so that the charge current Ic1 is set to be lower than the charge current Ic2.

Figure 20:
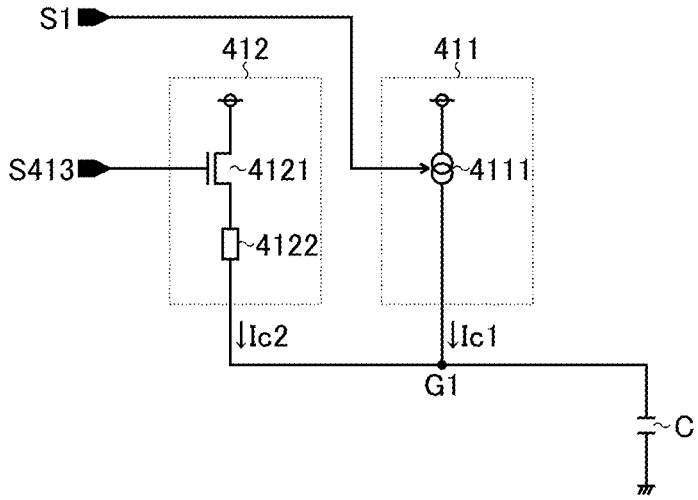
FIG. 20 is a diagram showing one configuration example of a first gate driver and a second gate driver.

FIG. 20 is a diagram showing one configuration example of the first and second gate drivers 411 and 412.

The first gate driver 411 includes a constant current source 4111. The constant current source 4111 is connected between a power terminal and the gate of the power device 402, and generates a constant charge current Ic1 according to the gate control signal S1. For example, the constant current source 4111 generates the charge current Ic1 when the gate control signal S1 is at high level, and does not generate the charge current Ic1 when the gate control signal S1 is at low level. In this way, the first gate driver 411 charges the gate capacitance of the power device 402 by constant-current driving.

The second gate driver 412 includes a switch 4121 and a resistor 4122. The switch 4121 and the resistor 4122 are connected in series between the power terminal and the gate of the power device 402, and generates the charge current Ic2 according to the AND signal S413. For example, in the second gate driver 412, when the AND signal S413 is at high level, the switch 4121 is on and the charge current Ic2 is generated; by contrast, when the AND signal S413 is at low level, the switch 4121 is off and the charge current Ic2 is not generated.

Note that the charge current Ic2 varies with the voltage across the resistor 4122. Specifically, as the charging of the gate capacitance proceeds and the gate driving signal G1 increases, the charge current Ic2 decreases. In this way, the second gate driver 412 charges the gate capacitance of the power device 402 by voltage driving (so called here in contrast to the constant-current driving mentioned above).

Figure 21:
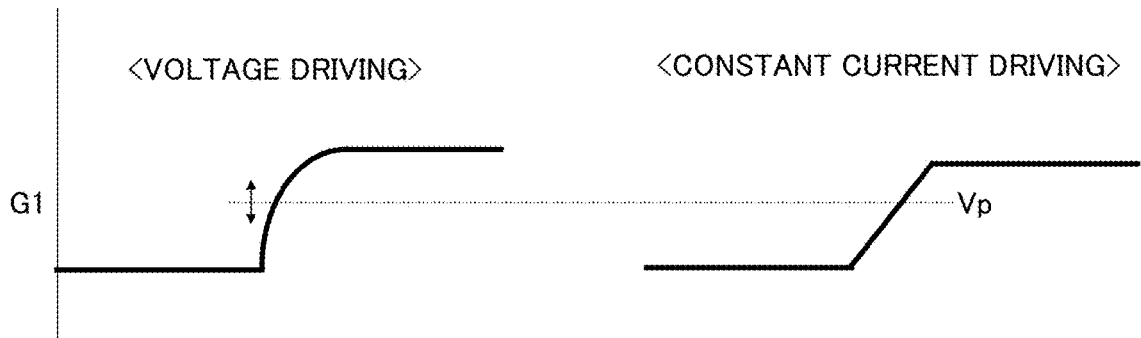
FIG. 21 is a diagram showing the difference between constant-current driving and voltage driving.

FIG. 21 is a diagram showing the difference between constant-current driving and voltage driving. As shown at left in the diagram, in voltage driving, the amount of electric charge injected into the gate varies depending on variation of the plateau voltage Vp. On the other hand, as shown at right in the diagram, in constant-current driving, variation of the plateau voltage Vp does not affect the amount of electric charge injected into the gate.

In view of the above, the following can be said: when the power device 402 is driven slowly in region α mentioned above, it is preferable to employ constant-current driving to give priority to raising the gate driving signal G1 with a desired gradient; on the other hand, when the power device 402 is driven fast in region β mentioned above, it is preferable to employ voltage driving to give priority to raising the gate driving signal G1 fast.

Overview

To follow is an overview of the various embodiments described herein.

For example, according to what is disclosed herein, a gate driver includes: a gate driving circuit configured to generate a gate driving signal for a power device according to a gate control signal; and a driving capacity switch circuit configured to raise the gate driving capacity of the gate driving circuit when a time-variation signal obtained by passing the gate driving signal in the on-transition period of the power device through a high-pass filter becomes lower than a threshold value. (A first configuration.)

In the gate driver of the first configuration described above, the driving capacity switch circuit may include: the high-pass filter configured to generate the time-variation signal by extracting from the gate driving signal a component of a frequency higher than the cutoff frequency; a comparator configured to compare the time-variation signal with the threshold value to generate a comparison signal; and a latch configured to receive the gate control signal and the comparison signal to generate a driving capacity switch signal for the gate driving circuit. (A second configuration.)

In the gate driver of the second configuration described above, the latch may be in a reset state when the gate control signal is at a logic level corresponding to an off state and may be in a reset-released state when the gate control signal is at a logic level corresponding to an on state. (A third configuration.)

In the gate driver of the second or third configuration described above, the driving capacity switch circuit may further include a delay circuit configured to delay and then output the gate control signal to the latch. (A fourth configuration.)

In the gate driver of any of the first to fourth configurations described above, the high-pass filter may be a first-order CR high-pass filter including a capacitor and a resistor. (A fifth configuration.)

In the gate driver of any of the first to fifth configurations described above, the threshold value may be a variable value. (A sixth configuration.)

In the gate driver of any of the first to sixth configurations described above, the gate driving circuit may include: a first gate driver; a second gate driver; and a logic gate configured to enable and disable the second gate driver according to an instruction from the driving capacity switch circuit. (A seventh configuration.)

In the gate driver of the seventh configuration described above, the first gate driver may be configured to charge the gate capacitance of the power device by constant-current driving, and the second gate driver may be configured to charge the gate capacitance of the power device by voltage driving. (An eighth configuration.)

In the gate driver of the eighth configuration described above, the first gate driver may include a constant current source. The constant current source may be configured to be connected between a power terminal and the gate of the power device. The second gate driver may include a switch and a resistor, and the switch and the resistor may be connected in series between the power terminal and the gate of the power device. (A ninth configuration.)

In the gate driver of any of the first to sixth configurations described above, the gate driving circuit may include: a first gate driver; and a second gate driver configured to have a different driving capacity from the first gate driver. The first and second gate drivers may be enabled and disabled individually and exclusively according to an instruction from the driving capacity switch circuit. (A tenth configuration.)

In the gate driver of any of the first to tenth configurations described above, the gate driving circuit and the driving capacity switch circuit may both be integrated in a semiconductor device. (A eleventh configuration.)

According to the disclosure herein, it is possible to provide a gate driver that can both reduce surges and noise and suppress switching loss.

Further Modifications

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present disclosure is defined not by the description of the embodiments given above but by the appended claims and encompasses any modifications within a scope equivalent in significance to what is claimed.

The invention claimed is:

1. A gate driver, comprising:

a gate driving circuit configured to generate a gate driving signal for a power device according to a gate control signal; and a driving capacity switch circuit configured to raise a gate driving capacity of the gate driving circuit when a time-variation signal obtained by passing the gate driving signal in an on-transition period of the power device through a high-pass filter becomes lower than a threshold value, wherein the gate driving circuit includes:

a first gate driver configured to charge a gate capacitance of the power device by constant-current driving;

a second gate driver configured to charge the gate capacitance of the power device by voltage driving; and a logic gate configured to enable and disable the second gate driver according to an instruction from the driving capacity switch circuit, the first gate driver includes a constant current source, the constant current source is configured to be connected between a power terminal and a gate of the power device, the second gate driver includes a switch and a resistor, and the switch and the resistor are connected in series between the power terminal and the gate of the power device.

2. The gate driver according to claim 1, wherein the driving capacity switch circuit includes:

the high-pass filter configured to generate the time-variation signal by extracting from the gate driving signal a component of a frequency higher than a cutoff frequency;

a comparator configured to compare the time-variation signal with the threshold value to generate a comparison signal; and a latch configured to receive the gate control signal and the comparison signal to generate a driving capacity switch signal for the gate driving circuit.

3. The gate driver according to claim 2, wherein the latch is in a reset state when the gate control signal is at a logic level corresponding to an off state and is in a reset-released state when the gate control signal is at a logic level corresponding to an on state.

4. The gate driver according to claim 2, wherein the driving capacity switch circuit further includes a delay circuit configured to delay and then output the gate control signal to the latch.

5. The gate driver according to claim 1, wherein the high-pass filter is a first-order CR high-pass filter including a capacitor and a resistor.

6. The gate driver according to claim 1, wherein the threshold value is a variable value.

7. The gate driver according to claim 1, wherein the gate driving circuit includes:

a first gate driver; and a second gate driver configured to have a different driving capacity from the first gate driver, and the first and second gate drivers are enabled and disabled individually and exclusively according to an instruction from the driving capacity switch circuit.

8. The gate driver according to claim 1, wherein the gate driving circuit and the driving capacity switch circuit are both integrated in a semiconductor device.

* * * * *